(12) United States Patent
Lang et al.

(10) Patent No.: US 12,740,408 B2
(45) Date of Patent: Sep. 15, 2026

(54) POWER MODULE, POWER SUPPLY CIRCUIT, AND CHIP

(71) Applicant: HUAWEI TECHNOLOGIES CO., LTD., Shenzhen (CN)

(72) Inventors: Fengqun Lang, Shanghai (CN); Yutao Wang, Shenzhen (CN); Huibin Chen, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 388 days.

(21) Appl. No.: 18/429,432

(22) Filed: Feb. 1, 2024

(65) Prior Publication Data

US 2024/0170439 A1 May 23, 2024

Related U.S. Application Data

(63) Continuation of application No. PCT/CN2022/095007, filed on May 25, 2022.

(30) Foreign Application Priority Data

Aug. 9, 2021 (CN) ........................ 202110908858.8

(51) Int. Cl.
*H10W 40/22* (2026.01)
*H10W 40/25* (2026.01)
(Continued)

(52) U.S. Cl.
CPC ......... *H10W 40/22* (2026.01); *H10W 40/258* (2026.01); *H10W 72/07331* (2026.01);
(Continued)

(58) Field of Classification Search
CPC ............... H10W 40/22; H10W 40/258; H10W 72/07331; H10W 72/325; H10W 90/731; H10W 72/351
See application file for complete search history.

(56) References Cited

U.S. PATENT DOCUMENTS

2007/0290217 A1* 12/2007 Daniels ................ H10W 90/00 257/E31.126
2009/0049686 A1* 2/2009 Park ...................... H05K 1/185 29/25.42
2015/0179611 A1* 6/2015 Lu ......................... H10W 42/20 257/659

FOREIGN PATENT DOCUMENTS

CN 1402342 A 3/2003
CN 102915985 A 2/2013
(Continued)

OTHER PUBLICATIONS ip.com search (Year: 2026).*
(Continued)

*Primary Examiner* — Zandra V Smith
*Assistant Examiner* — Andre C Stevenson

(57) ABSTRACT

A power module includes a first metal layer-clad substrate and a second metal layer-clad substrate that are disposed opposite to each other, and a chip and an interconnection pillar that are located between the first metal layer-clad substrate and the second metal layer-clad substrate. The chip and the first metal layer-clad substrate are electrically connected through press sintering by using a sintering material to improve bonding reliability. The chip is electrically connected to the second metal layer-clad substrate by using the interconnection pillar.

20 Claims, 13 Drawing Sheets

(51) Int. Cl.

| | |
|---|---|
| ***H10W 72/00*** | (2026.01) |
| ***H10W 72/30*** | (2026.01) |
| ***H10W 90/00*** | (2026.01) |

(52) U.S. Cl.

CPC ........ *H10W 72/325* (2026.01); *H10W 72/351* (2026.01); *H10W 90/731* (2026.01)

(56) References Cited

FOREIGN PATENT DOCUMENTS

| | | | |
|---|---|---|---|
| CN | 103620764 | A | 3/2014 |
| CN | 106057935 | A | 10/2016 |
| CN | 106475702 | A | 3/2017 |
| CN | 106653977 | A | 5/2017 |
| CN | 206379344 | U | 8/2017 |
| CN | 109920785 | A | 6/2019 |
| CN | 110690120 | A | 1/2020 |
| CN | 111903049 | A | 11/2020 |
| CN | 112736058 | A | 4/2021 |
| CN | 112771665 | A | 5/2021 |
| CN | 113809032 | A | 12/2021 |
| DE | 102019003027 | A1 | 11/2019 |
| JP | H08316369 | A | 11/1996 |
| JP | 2000183234 | A | 6/2000 |
| JP | 2009117428 | A | 5/2009 |
| JP | 2015072959 | A | 4/2015 |
| JP | 2018116994 | A | 7/2018 |
| JP | 2019062739 | A | 4/2019 |
| JP | 2019079957 | A | 5/2019 |
| JP | 2020141023 | A | 9/2020 |
| JP | 6803106 | B1 | 12/2020 |
| JP | 2021034590 | A | 3/2021 |
| JP | 2021061393 | A | 4/2021 |
| WO | 2012133098 | A1 | 10/2012 |
| WO | 2017169086 | A1 | 10/2017 |
| WO | 2018025571 | A1 | 2/2018 |
| WO | 2021039874 | A1 | 3/2021 |

OTHER PUBLICATIONS

Chinese Allowance Report (Year: 2025).*

European Patent Organization Allowance report (Year: 2024).*

Japanese Allowance report (Year: 2025).*

* cited by examiner

POWER MODULE, POWER SUPPLY CIRCUIT, AND CHIP

CROSS-REFERENCE TO RELATED APPLICATIONS

This application is a continuation of International Application PCT/CN2022/095007, filed on May 25, 2022, which claims priority to Chinese Patent Application No. 202110908858.8, filed on Aug. 9, 2021. The disclosures of the aforementioned priority applications are hereby incorporated by reference in their entirety.

TECHNICAL FIELD

This application relates to the field of semiconductor packaging technologies, and in particular, to a power module, a power supply circuit, and a chip.

BACKGROUND

With development of power electronics technologies, a power module has attracted increasingly more attention. In addition, the power module is urgently required to be lighter and smaller to save energy and reduce costs. However, this requirement brings a great challenge to development of the power module, because lightweight and miniaturization cause an increase in current density of the module, which causes relatively high heat to be generated inside the module, thereby causing an increase in a junction temperature. If the generated heat cannot be discharged in a timely manner, a relatively high junction temperature affects overall thermal mechanical performance and reliability of the power module.

SUMMARY

This application provides a power module, a power supply circuit, and a chip, to provide a power module with relatively high heat dissipation performance, power density, and reliability.

According to a first aspect, this application provides a power module, including a first metal layer-clad substrate and a second metal layer-clad substrate that are disposed opposite to each other, and a chip and an interconnection pillar that are located between the first metal layer-clad substrate and the second metal layer-clad substrate. A sintering material is further disposed between the chip and the first metal layer-clad substrate, and the chip and the first metal layer-clad substrate are electrically connected through press sintering by using the sintering material. The sintering material may include at least one of silver paste, copper paste, or a silver film. The interconnection pillar is located between the chip and the second metal layer-clad substrate, and the chip is electrically connected to the second metal layer-clad substrate by using the interconnection pillar. Because substrates are disposed on both sides of the chip, heat generated inside the power module may be discharged from directions of the first metal layer-clad substrate and the second metal layer-clad substrate, thereby improving heat dissipation performance of the power module. In addition, the sintering material has low stress, and the chip and the first metal layer-clad substrate are electrically connected in a press sintering manner, to improve bonding reliability. In addition, the sintering material in this application has advantages of a low sintering temperature, a high melting point, and high thermal conductivity. Therefore, not only the heat dissipation performance of the power module may be further improved, but also an operating ambient temperature and a service life of the power module may be improved, thereby improving power density of the power module.

During specific implementation, the first metal layer-clad substrate and the second metal layer-clad substrate may be direct bond copper (DBC) substrates, active metal brazed copper (AMB, for example, $Al_2O_3$-AMB, $Si_3N_4$-AMB, or AlN-AMB) substrates, insulated metal substrates (IMSs), or the like, and are not limited herein.

For example, to further improve power density, the first metal layer-clad substrate and the second metal layer-clad substrate may be made of AlN-DBC, $Si_3N_4$-AMB, or AlN-AMB with high thermal conductivity. This is not limited herein.

For example, the sintering material may be made of silver paste, copper paste, or a silver film.

During specific implementation, the silver paste may include at least one of micrometer silver particle paste=and nanometer silver particle paste=. The micrometer silver particle paste is silver paste made of micrometer silver particles and organic solvent, and is low-cost and safe. The micrometer silver particle paste is generally used for sintering under pressure, the sintering material has high tightness, an interface of a bonded body is firmly bonded, and bonding reliability is high. The nanometer silver particle paste is silver paste made of nanometer silver particles and organic solvent, and is costly and has an operational safety risk of nanometer particles.

Optionally, to improve reliability of sinter bonding and reduce costs, the sintering material in this application may be made of micrometer silver particle paste=.

To further improve the reliability of sinter bonding, an elastic modulus, a coefficient of thermal expansion (CTE), and the like of the sintering material may be adjusted by adding a material to the sintering material. For example, the sintering material includes a matrix material and a filler filled in the matrix material. The matrix material includes at least one of silver paste, copper paste, or a silver film. The filler is made of a material having good bonding performance with the matrix material, and a coefficient of thermal expansion of the filler is less than a coefficient of thermal expansion of the matrix material, thereby improving the reliability of sinter bonding.

For example, the matrix material is micrometer silver particle paste. A filler is added to the micrometer silver particle paste, to reduce a coefficient of thermal expansion of the micrometer silver particle paste and reduce bonding stress, thereby improving reliability of silver sinter bonding. For example, the filler may include at least one of nickel (Ni), Ni alloy, copper (Cu), nickel-plated copper, titanium (Ti), Ti alloy, iron (Fe), Fe alloy, Kovar alloy (Kovar, iron-nickel-cobalt alloy 4J29), SiC powder, and the like. This is not limited herein.

In this application, metal layers with which surfaces of the first metal layer-clad substrate and the second metal layer-clad substrate are clad are generally copper. When the sintering material is silver paste or a silver film, to improve bonding performance between the sintering material and the first metal layer-clad substrate, the first metal layer-clad substrate may be plated with silver at a sintering position, that is, the first metal layer-clad substrate is covered with a silver plating layer in a zone corresponding to the sintering material. For example, a thickness of the silver plating layer may be controlled to be between 0.1 μm and 30 μm. Certainly, if the sintering material has relatively good bonding performance with the first metal layer-clad substrate, silver plating may not be required. For example, when the sintering material is copper paste, silver plating is not required at the sintering position of the first metal layer-clad substrate.

For example, press sintering may include the following steps: Step (1): When the sintering material is copper paste or silver paste, the copper paste or the silver paste may be printed in a corresponding sintering zone of the first metal layer-clad substrate by using a stencil printing technique or a screen printing technique. Then, the copper paste or the silver paste printed on the first metal layer-clad substrate may be pre-dried for 5 minutes to 40 minutes at a temperature of 100° C. to 180° C. in an atmosphere of N2. Then, the chip is fastened to the dried copper paste or silver paste through vacuum adsorption, and pressure of 0.1 MPa to 10 MPa is applied to the chip mounted on the first metal layer-clad substrate for at least 10 ms in an environment with a temperature of 100° C. to 180° C. When the sintering material is a silver film, the chip may be adsorbed by using a metal suction nozzle, and a temperature of the metal suction nozzle is 80° C. to 200° C. Then, the chip is pressed onto a large silver film, and pressure of 0.1 MPa to 5 MPa is applied to the chip for a time of 1 ms to 10000 ms. In this way, the silver film under the chip is compressed and semi-sintered, and adheres to the chip. Then, the chip to which the silver film adheres is fastened to the first metal layer-clad substrate through vacuum adsorption, and pressure of 0.1 MPa to 10 MPa is applied to the chip mounted on the first metal layer-clad substrate for at least 10 ms in an environment with a temperature of 100° C. to 180° C. Step (2): A pressurization head may be used to perform press sintering on the chip mounted on the first metal layer-clad substrate. An area of the pressurization head being 50 mm*50 mm is used as an example. Parallelism of the pressurization head may be set to be ≤5 μm, so that warpage of a product obtained through sintering may be reduced. For example, sintering conditions for performing press sintering may be as follows: A sintering temperature is controlled to be between 200° C. and 300° C., applied pressure is controlled to be between 5 MPa and 30 MPa, and a sintering time is controlled to be between 1 minute and 10 minutes. To prevent damage caused by the pressurization head to the chip in a sintering process, when press sintering is performed on the chip mounted on the first metal layer-clad substrate, a removable stress relief film may be further placed between the chip and the pressurization head. Therefore, when press sintering is performed, the stress relief film can avoid direct contact between the pressurization head and the chip, and reduce damage caused by the pressurization head to the chip due to stress concentration. After press sintering is completed, the stress relief film may be removed. For example, the stress relief film may be an organic film such as a Teflon film. This is not limited herein.

Further, to control a warping degree of the product obtained through sintering, the first metal layer-clad substrate and the chip that are sintered may be cooled in a pressurized state. For example, cooling conditions may be as follows: Applied pressure is controlled to be between 5 MPa and 20 MPa, and a cooling time is controlled to be between 1 minute and 10 minutes.

Optionally, after press sintering is performed on the chip mounted on the first metal layer-clad substrate, the first metal layer-clad substrate on which the chip is mounted may be further cleaned, to remove residual organic matter. For example, a plasma treatment technique or an organic solvent cleaning technique is used to remove residual organic matter at the first metal layer-clad substrate and the like, thereby increasing interface bonding performance of a subsequent molding compound, preventing the molding compound from being delaminated, and further improving reliability of the power module.

Optionally, to release stress generated on the chip when the chip is welded or sintered, thereby improving the reliability of the power module, a side that is of the chip and that faces the first metal layer-clad substrate and a side that is of the chip and that is away from the first metal layer-clad substrate each have a surface electrode, and the surface electrode includes a welded or sintered metal layer; the surface electrode located on the side that is of the chip and that faces the first metal layer-clad substrate further includes a stress buffer metal layer located on a side that is of the welded or sintered metal layer and that is away from the first metal layer-clad substrate; and/or the surface electrode located on the side that is of the chip and that is away from the first metal layer-clad substrate further includes a stress buffer metal layer located on a side that is of the welded or sintered metal layer and that faces the first metal layer-clad substrate.

For example, a material of the stress buffer metal layer may be soft metal whose hardness is less than HV60, for example, aluminum, aluminum alloy, copper, magnesium alloy, zinc, zinc alloy, silver, silver alloy, gold, or gold alloy. Stress of a joint is released by using a softness characteristic of the soft metal.

During specific implementation, when the material of the stress buffer metal layer is non-weldable metal, for example, aluminum, aluminum alloy, or magnesium alloy, the stress buffer metal layer may be disposed under the welded or sintered metal layer.

For example, the welded or sintered metal layer may include Ti/Ni/Ag, Ti/Ni/Au, Ti/NiV/Ag, Ti/NiV/Au, Ni(P)/Pd/Au, Ni(P)/Pd/Ag, Ni(P)/Au, Ni(P)/Ag, or the like.

During specific implementation, first solder may be used to connect the interconnection pillar to the side that is of the chip and that is away from the first metal layer-clad substrate in a welding manner, and second solder may be used to connect a side that is of the interconnection pillar and that is away from the chip to the second metal layer-clad substrate in a welding manner.

During specific implementation, a thickness of solder has significant impact on solder bonding reliability and the like. To ensure that the thickness of the solder is controllable and uniform, at least one first support pillar is disposed between the interconnection pillar and the chip, where the at least one first support pillar may be formed on a side that is of the interconnection pillar and that faces the chip, that is, formed on the interconnection pillar; or the at least one first support pillar may be formed on a side that is of the chip and that faces the interconnection pillar, that is, formed on the chip; and/or at least one second support pillar is disposed between the interconnection pillar and the second metal layer-clad substrate, where the at least one second support pillar may be formed on a side that is of the interconnection pillar and that faces the second metal layer-clad substrate, that is, formed on the interconnection pillar; or the at least one second support pillar may be formed on a side that is of the second metal layer-clad substrate and that faces the interconnection pillar, that is, formed on the second metal layer-clad substrate.

In addition to the chip and the interconnection pillar, the power module in this application may further include an electronic component located on a side that is of the first metal layer-clad substrate and that faces the second metal layer-clad substrate, and the electronic component is connected to the first metal layer-clad substrate by using third solder.

In this application, the first solder, the second solder, and the third solder may be made of solder paste or a soldering lug. This is not limited herein.

Optionally, all solder in this application may be made of a same material. For example, the first solder, the second solder, and the third solder are made of same solder. In this way, welding between the chip and the interconnection pillar, welding between the interconnection pillar and the second metal layer-clad substrate, and welding between the electronic component and the first metal layer-clad substrate may be completed through reflow soldering once, thereby simplifying process steps and reducing costs.

Certainly, during specific implementation, the first solder, the second solder, and the third solder may alternatively be different solder. This is not limited herein. For example, the first solder and the third solder may be high-temperature solder, for example, high-lead solder or Au-based solder, and the second solder may be medium-temperature solder, for example, SAC305 or Sn—Sb solder.

For example, the electronic component in this application includes any electronic component, such as a signal terminal, a power terminal, or a thermistor, that is welded onto the first metal layer-clad substrate by using solder.

To improve bonding reliability between the electronic component and the first metal layer-clad substrate, at least one third support pillar is further disposed between the electronic component and the first metal layer-clad substrate. The at least one third support pillar may be formed on a side that is of the electronic component and that faces the first metal layer-clad substrate, or may be formed on a side that is of the first metal layer-clad substrate and that faces the electronic component. This is not limited herein.

Optionally, a material of the support pillar is a conductive material. For example, the support pillar may be made of at least one of Al, Al alloy, Au, Au alloy, Cu, Cu alloy, Ni, Ni alloy, copper coated with aluminum, Cu—Sn alloy with a high melting point, or high-temperature solder.

Further, this application further includes a molding compound that is filled between the first metal layer-clad substrate and the second metal layer-clad substrate and that is used to package the first metal layer-clad substrate and the second metal layer-clad substrate in plastic. To prevent delamination between the molding compound and a molding compound interface, thereby improving the reliability of the power module, a molding compound with a low modulus is used as the molding compound. For example, the molding compound may be made of a material whose elastic modulus is between 0.5 GPa and 20 GPa, for example, an epoxy molding compound. This is not limited herein.

The power module in this application may further include a first heat sink located on a side that is of the first metal layer-clad substrate and that is away from the second metal layer-clad substrate, and a second heat sink located on a side that is of the second metal layer-clad substrate and that is away from the first metal layer-clad substrate, to cool the module on both sides, thereby improving power density and module reliability of the power module.

Optionally, to improve a heat dissipation effect, the first heat sink may be connected to the first metal layer-clad substrate in a welding manner or a sintering manner; and/or the second heat sink may be connected to the second metal layer-clad substrate in a welding manner or a sintering manner.

Further, there is a first support component between the first heat sink and the first metal layer-clad substrate, and the first support component may include a plurality of fourth support pillars, metal wires, or metal meshes; and/or there is a second support component between the second heat sink and the second metal layer-clad substrate, and the second support component may include a plurality of fifth support pillars or metal wires, so that the first support component and the second support component are used to control a solder thickness, thereby ensuring welding reliability.

During specific implementation, the metal wire may be bonded and fastened to a joint surface of the heat sink or a heat dissipation surface of the power module, to prevent the metal wire from flowing with liquid metal during backflow.

According to a second aspect, an embodiment of this application further provides a power supply circuit, including a circuit board and the power module according to the first aspect or the implementations of the first aspect. The power module is electrically connected to the circuit board, and the circuit board provides a signal for the power module.

For technical effects that can be achieved in the second aspect, refer to descriptions of technical effects that can be achieved in any possible design of the first aspect. Details are not described herein.

According to a third aspect, an embodiment of this application further provides a chip. A surface electrode of the chip includes a stress buffer metal layer and a welded or sintered metal layer that are disposed in a laminated manner. A material of the stress buffer metal layer may be soft metal whose hardness is less than HV60, and stress of a joint is released by using a softness characteristic of the soft metal.

For example, the soft metal may include at least one of aluminum, aluminum alloy, copper, magnesium alloy, zinc, zinc alloy, silver, silver alloy, gold, gold alloy, and the like. This is not limited herein.

During specific implementation, when the material of the stress buffer metal layer is non-weldable metal, for example, aluminum, aluminum alloy, or magnesium alloy, the stress buffer metal layer may be disposed under the welded or sintered metal layer.

For example, the welded or sintered metal layer may include Ti/Ni/Ag, Ti/Ni/Au, Ti/NiV/Ag, Ti/NiV/Au, Ni(P)/Pd/Au, Ni(P)/Pd/Ag, Ni(P)/Au, or Ni(P)/Ag. This is not limited herein.

DESCRIPTION OF EMBODIMENTS

Figure 1:
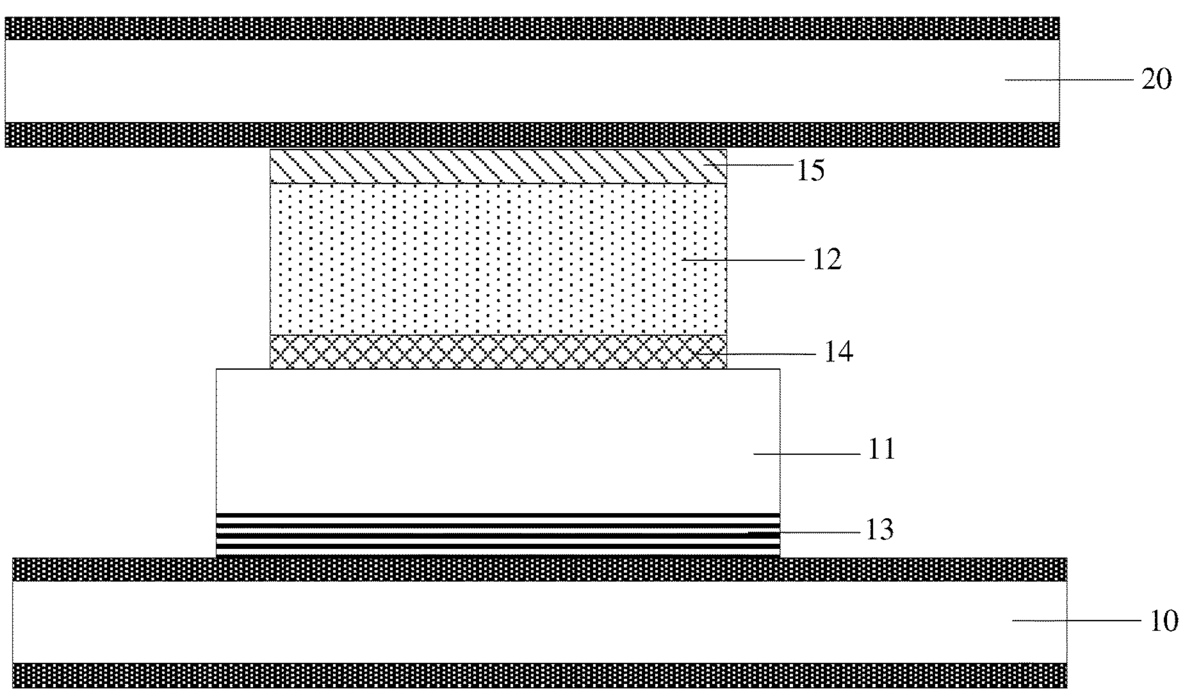
FIG. 1 is a schematic diagram of a structure of a power module according to an embodiment of this application.

To make the objectives, technical solutions, and advantages of this application clearer, the following further describes this application in detail with reference to accompanying drawings.

It should be noted that, in this specification, similar reference numerals and letters in the following accompanying drawings represent similar items. Therefore, once an item is defined in an accompanying drawing, the item does not need to be further defined or interpreted in the following accompanying drawings.

In descriptions of this application, it should be noted that orientation or location relationships indicated by terms "center", "above", "below", "left", "right", "vertical", "horizontal", "inner", "outer", and the like are orientation or location relationships based on the accompanying drawings, and are merely intended for conveniently describing this application and simplifying descriptions, rather than indicating or implying that an apparatus or an element in question needs to have a specific orientation or needs to be constructed and operated in a specific orientation, and therefore cannot be construed as a limitation on this application. Expressions of positions and directions in this application are described by using the accompanying drawings as an example. However, changes may be made based on a requirement, and the changes fall within the protection scope of the present invention. The accompanying drawings in this application are merely used to illustrate a relative position relationship and do not represent a true scale. In addition, terms "first" and "second" are merely used for a purpose of description, and shall not be understood as an indication or implication of relative importance.

In descriptions of this application, it should be noted that unless otherwise expressly specified and limited, terms "mount", "interconnect", and "connect" should be understood in a broad sense. For example, the terms may indicate a fixed connection, a detachable connection, or an integral connection; may be a mechanical connection or an electrical connection; or may be direct interconnection, indirect interconnection through an intermediate medium, or communication between the interior of two elements. A person of ordinary skill in the art may understand specific meanings of the foregoing terms in this application based on a specific situation.

For ease of understanding of a power module provided in embodiments of this application, an application scenario of the power module is first described. The power module is widely used in a power supply circuit. The power module is a semiconductor apparatus that converts a voltage, a current, a frequency, and the like of a power supply, and is a core apparatus for a power supply circuit to perform power conversion. For example, the power supply circuit may be used as a core apparatus that is for conversion from a direct current to an alternating current and that is of a motor control unit (MCU) of an electric vehicle, and used as a battery of the electric vehicle to output a direct current, or convert the direct current into an alternating current required for vehicle running.

The power module is urgently required to be lighter and smaller to save energy and reduce costs. However, this requirement brings a great challenge to development of the power module, because lightweight and miniaturization cause an increase in current density of the module, which causes relatively high heat to be generated inside the module, thereby causing an increase in a junction temperature. If the generated heat cannot be discharged in a timely manner, a relatively high junction temperature affects overall thermal mechanical performance and reliability of the module.

Based on this, this application provides a power module with high heat dissipation performance, power density, and reliability. For ease of understanding of the technical solutions in this application, the following specifically describes the power module provided in this application, with reference to the accompanying drawings and specific implementations.

With reference to FIG. 1, FIG. 1 is a schematic diagram of a structure of a power module according to an embodiment of this application. The power module 1 includes a first metal layer-clad substrate 10 and a second metal layer-clad substrate 20 that are disposed opposite to each other, and a chip 11 and an interconnection pillar 12 that are located between the first metal layer-clad substrate 10 and the second metal layer-clad substrate 20. A sintering material 13 is further disposed between the chip 11 and the first metal layer-clad substrate 10, and the chip 11 and the first metal layer-clad substrate 10 are electrically connected through press sintering by using the sintering material 13. The sintering material 13 may include at least one of silver paste, copper paste, or a silver film. The interconnection pillar 12 is located between the chip 11 and the second metal layer-clad substrate 20, and the chip 11 is electrically connected to the second metal layer-clad substrate 20 by using the interconnection pillar 12. Because substrates are disposed on both sides of the chip 11, heat generated inside the power module may be discharged from directions of the first metal layer-clad substrate 10 and the second metal layer-clad substrate 20, thereby improving heat dissipation performance of the power module. In addition, the sintering material has low stress, and the chip 11 and the first metal layer-clad substrate 10 are electrically connected in a press sintering manner, to improve bonding reliability. In addition, the sintering material 13 in this application has advantages of a low sintering temperature, a high melting point, and high thermal conductivity. Therefore, not only the heat dissipation performance of the power module may be further improved, but also an operating ambient temperature and a service life of the power module may be improved, thereby improving power density of the power module.

Figure 2:
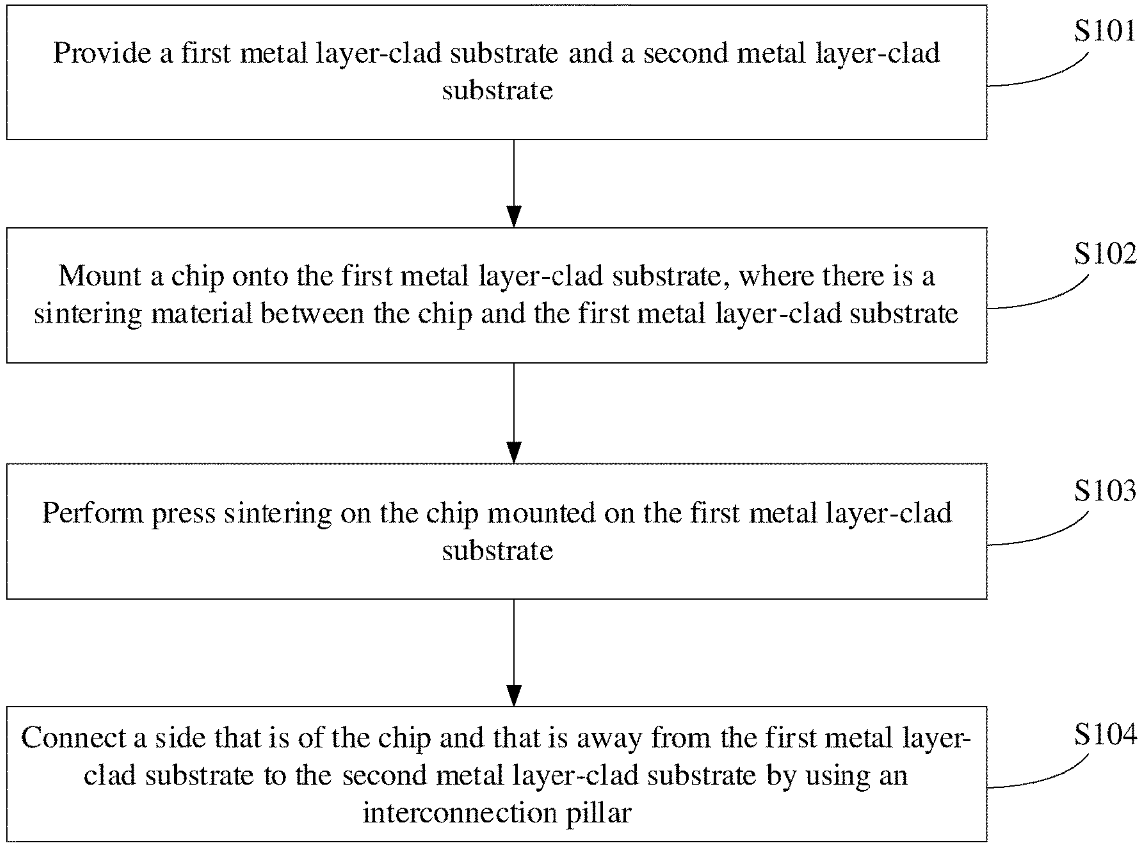
FIG. 2 is a schematic flowchart of a power module preparation method according to an embodiment of this application.

With reference to FIG. 2, FIG. 2 is a schematic flowchart of a power module preparation method according to an embodiment of this application. The preparation method may include the following steps.

S101: Provide a first metal layer-clad substrate and a second metal layer-clad substrate.

During specific implementation, the first metal layer-clad substrate and the second metal layer-clad substrate may be direct bond copper (DBC) substrates, active metal brazed copper (AMB, for example, $Al_2O_3$-AMB, $Si_3N_4$-AMB, or AlN-AMB) substrates, insulated metal substrates (IMSs), or the like, and are not limited herein.

For example, to further improve power density, the first metal layer-clad substrate and the second metal layer-clad substrate may be made of AlN-DBC, $Si_3N_4$-AMB, or AlN-AMB with high thermal conductivity. This is not limited herein.

S102: Mount a chip onto the first metal layer-clad substrate, where there is a sintering material between the chip and the first metal layer-clad substrate.

For example, the sintering material may be made of silver paste, copper paste, or a silver film.

During specific implementation, the silver paste may include at least one of micrometer silver particle paste and nanometer silver particle paste. The micrometer silver particle paste is silver paste made of micrometer silver particles and organic solvent, and is low-cost and safe. The micrometer silver particle paste is generally used for sintering under pressure, the sintering material has high tightness, an interface of a bonded body is firmly bonded, and bonding reliability is high. The nanometer silver particle paste is silver paste made of nanometer silver particles and organic solvent, and is costly and has an operational safety risk of nanometer particles.

Optionally, to improve reliability of sinter bonding and reduce costs, the sintering material in this application may be made of micrometer silver particle paste.

To further improve the reliability of sinter bonding, an elastic modulus, a coefficient of thermal expansion (CTE), and the like of the sintering material may be adjusted by adding a material to the sintering material. For example, the sintering material includes a matrix material and a filler in the matrix material. The matrix material includes at least one of silver paste, copper paste, or a silver film. The filler is made of a material having good bonding performance with the matrix material, and a coefficient of thermal expansion of the filler is less than a coefficient of thermal expansion of the matrix material, thereby improving the reliability of sinter bonding.

For example, the matrix material is micrometer silver particle paste. A filler is added to the micrometer silver particle paste, to reduce a coefficient of thermal expansion of the micrometer silver particle paste and reduce bonding stress, thereby improving reliability of silver sinter bonding. For example, the filler may include at least one of nickel (Ni), Ni alloy, copper (Cu), nickel-plated copper, titanium (Ti), Ti alloy, iron (Fe), Fe alloy, Kovar alloy (Kovar, iron-nickel-cobalt alloy 4J29), SiC powder, and the like. This is not limited herein.

Figure 3:
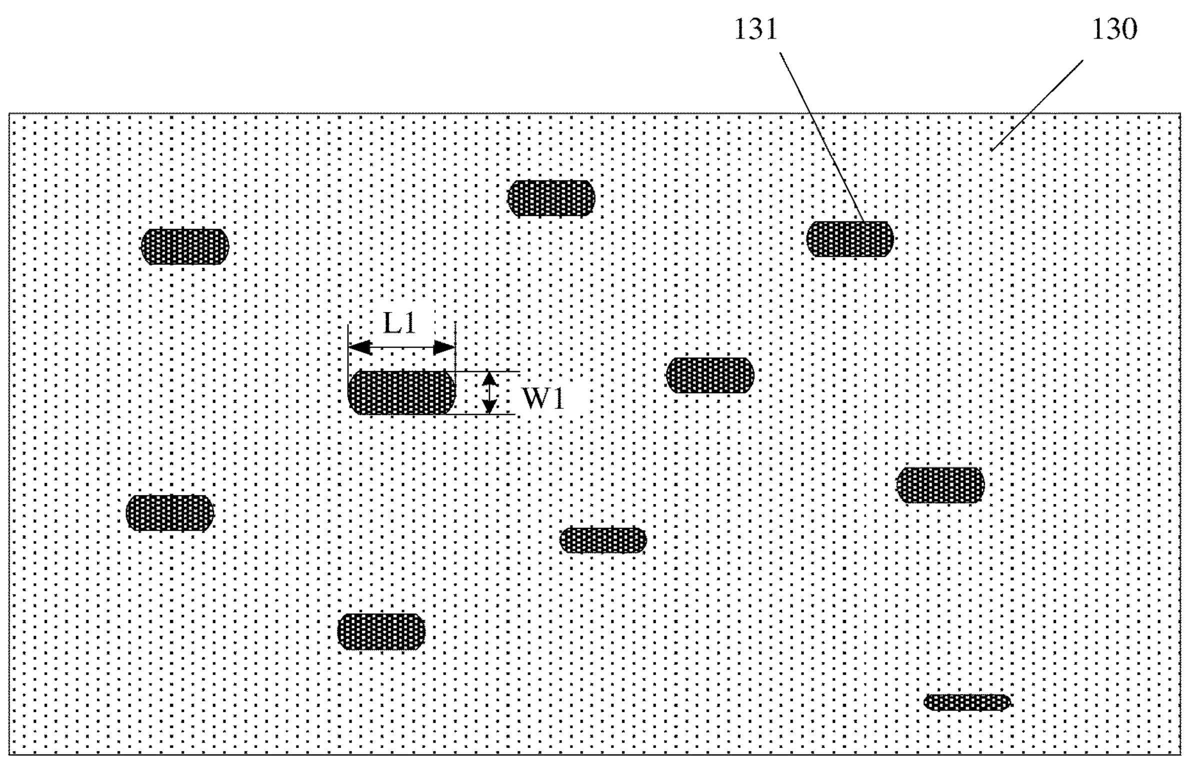
FIG. 3 is a schematic diagram of a cross section of a sintering material filled with a filler according to an embodiment of this application.

A shape of the filler is not limited in this application. For example, as shown in FIG. 3, a length L1 of the filler 131 may be controlled to be between 20 μm and 100 μm, and a size W1 of the filler 131 in a vertical length direction may be controlled to be between 20 nm and 30 μm. A cross section along a length direction may be a circle, an ellipse, a polygon, or the like.

In this application, metal layers with which surfaces of the first metal layer-clad substrate and the second metal layer-clad substrate are clad are generally copper. When the sintering material is silver paste or a silver film, to improve bonding performance between the sintering material and the first metal layer-clad substrate, the first metal layer-clad substrate may be plated with silver at a sintering position, that is, the first metal layer-clad substrate is covered with a silver plating layer in a zone corresponding to the sintering material. For example, a thickness of the silver plating layer may be controlled to be between 0.1 μm and 30 μm. Certainly, if the sintering material has relatively good bonding performance with the first metal layer-clad substrate, silver plating may not be required. For example, when the sintering material is copper paste, silver plating is not required at the sintering position of the first metal layer-clad substrate.

Figure 4:
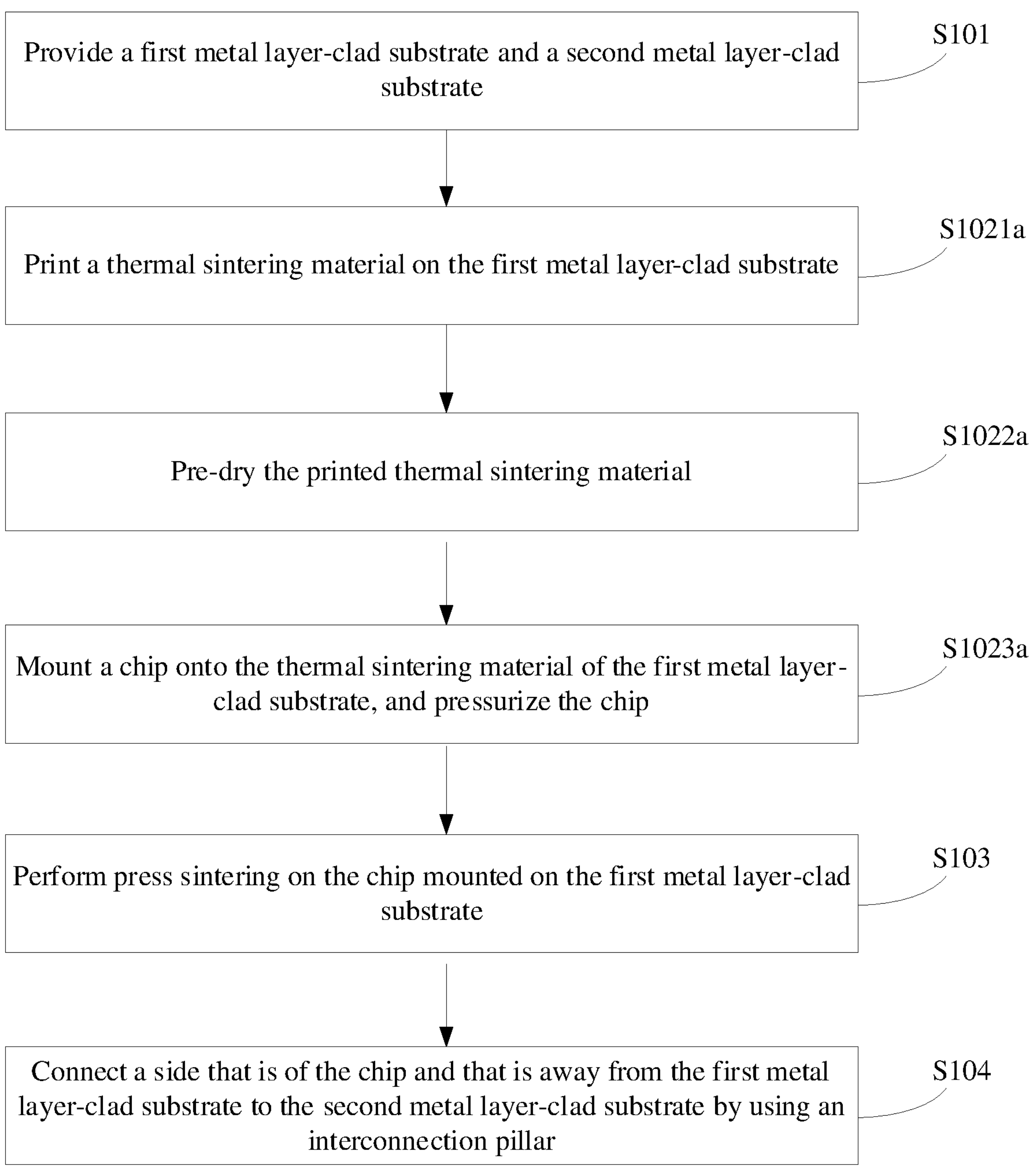
FIG. 4 is a schematic flowchart of another power module preparation method according to an embodiment of this application.
Figure 5:
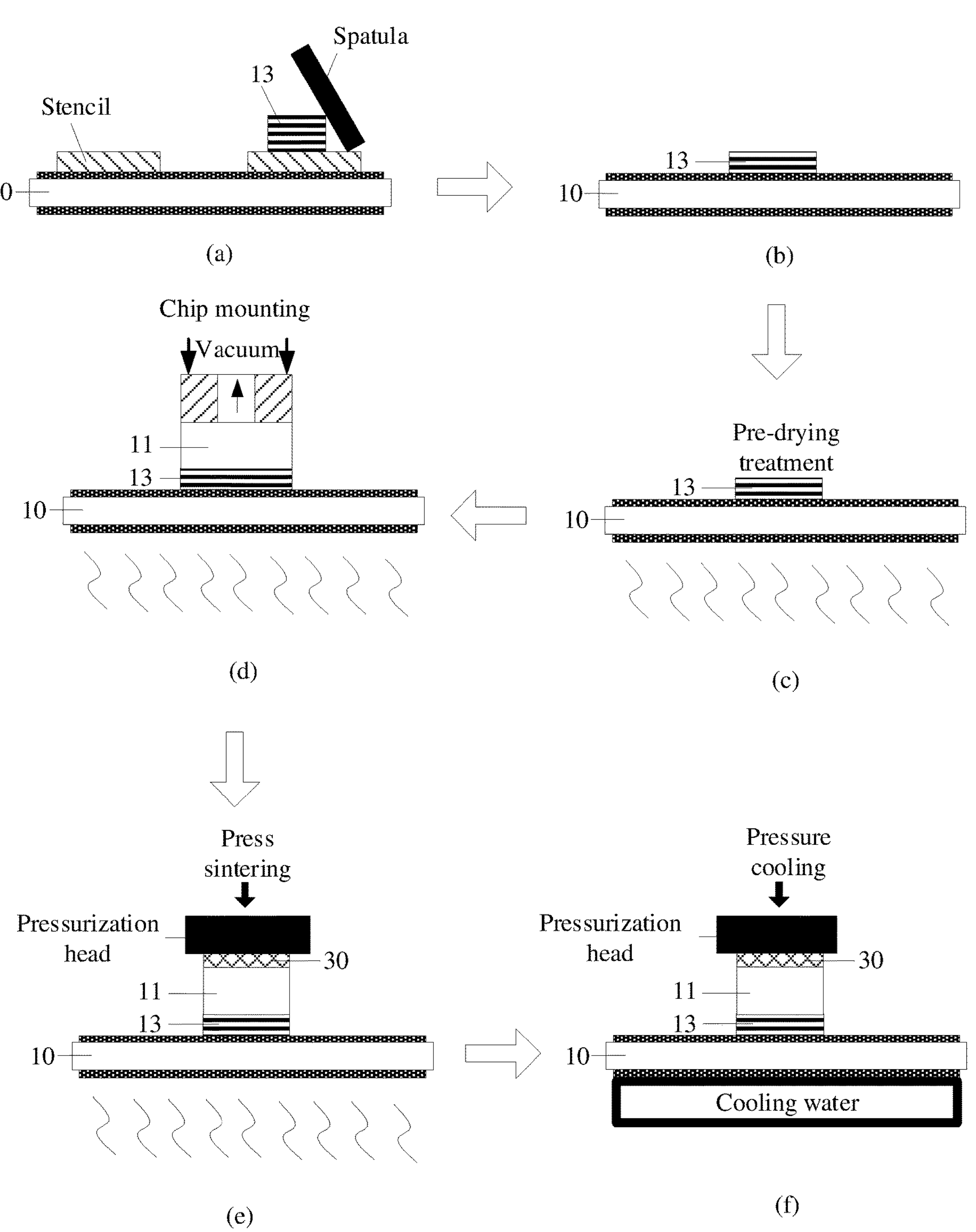
FIG. 5 is a schematic diagram of a structure of a power module preparation process according to an embodiment of this application.

For example, when the sintering material is copper paste or silver paste, with reference to FIG. 4 and FIG. 5, the chip may be mounted onto the first metal layer-clad substrate by using the following steps.

S1021*a*: Print the sintering material on the first metal layer-clad substrate.

During specific implementation, as shown in (a) and (b) in FIG. 5, the sintering material 13 (copper paste or silver paste) may be printed in a corresponding sintering zone of the first metal layer-clad substrate 10 by using a stencil printing technique or a screen printing technique. Compared with the screen printing technique, the stencil printing technique has lower costs and simpler production. Therefore, optionally, in this application, the copper paste or the silver paste is printed in the corresponding sintering zone of the first metal layer-clad substrate by using the stencil printing technique.

For example, a thickness of the printed copper paste or silver paste may be controlled to be between 30 μm and 160 μm, and may be specifically designed based on an actual product. This is not limited herein.

Optionally, an area of the printed copper paste or silver paste may be set to be greater than an area of a corresponding sintering zone on the chip, to absorb an alignment error between the chip and the sintering material. A boundary of the copper paste or the silver paste may extend outward by 20 μm to 300 μm compared with a target boundary (a boundary of the sintering zone of the chip in an ideal state).

S1022*a*: Pre-dry the printed sintering material.

During specific implementation, pre-drying the printed copper paste or silver paste is to prevent the sintering material from being crushed during pressure sintering.

For example, as shown in (c) in FIG. 5, the sintering material 13 (copper paste or silver paste) printed on the first metal layer-clad substrate 10 may be pre-dried for 5 minutes to 40 minutes at a temperature of 100° C. to 180° C. in an atmosphere of N2.

S1023*a*: Mount the chip onto the sintering material of the first metal layer-clad substrate, and pressurize the chip.

During specific implementation, as shown in (d) in FIG. 5, the chip 11 may be first sucked up through vacuum adsorption, then the sintering material 13 (copper paste or silver paste) may be aligned by using a profile identification system, and then the chip 11 may be fastened to the dried sintering material 13 (copper paste or silver paste) and pressurized.

For example, chip mounting conditions may be as follows: A temperature is controlled to be between 100° C. and 180° C., pressure is controlled to be between 0.1 MPa and 10 MPa, and a time is controlled to be between 10 ms and 999 ms. That is, pressure of 0.1 MPa to 10 MPa is applied to the chip 11 mounted on the first metal layer-clad substrate 10 for at least 10 ms in an environment with a temperature of 100° C. to 180° C.

Figure 6:
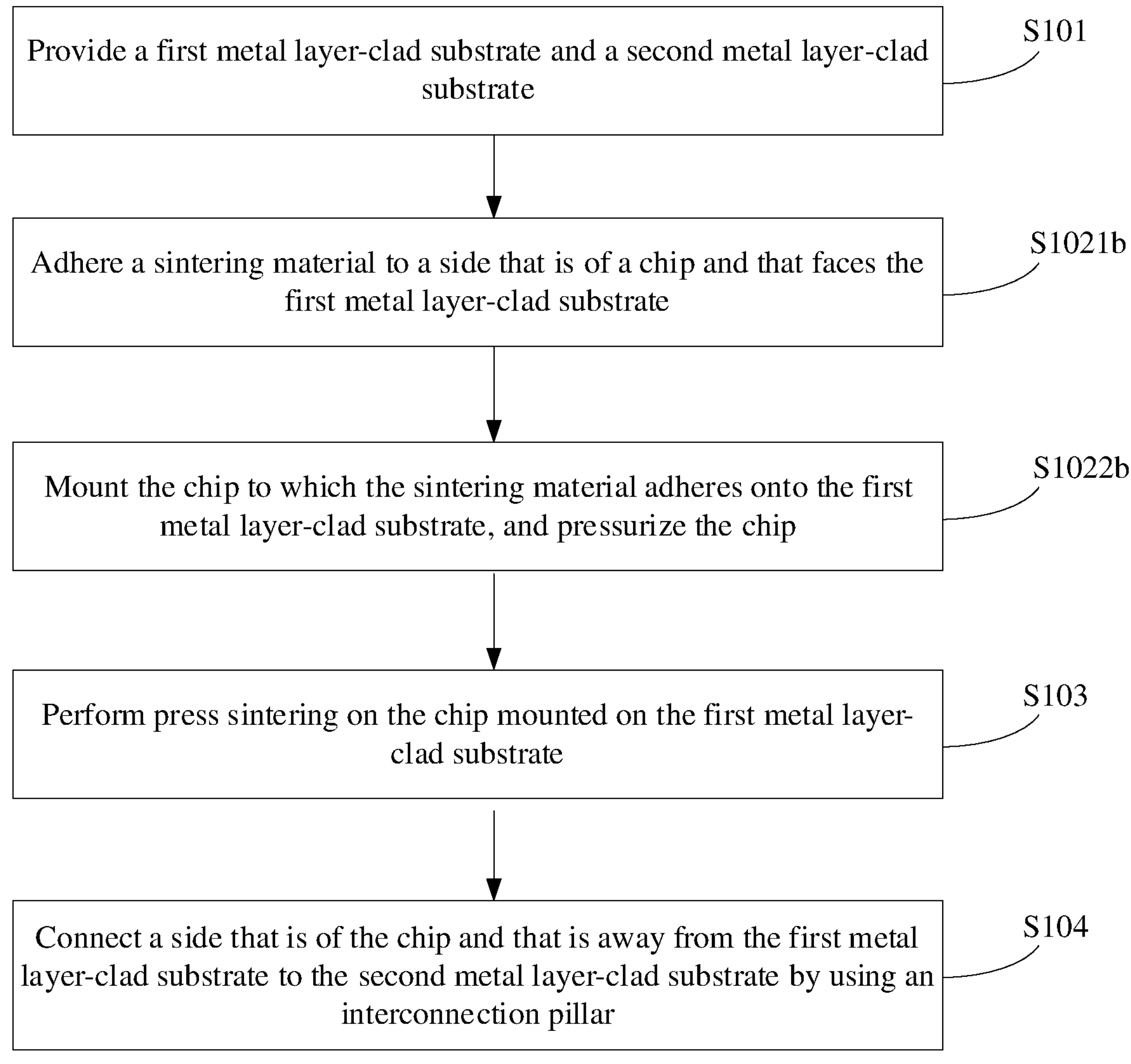
FIG. 6 is a schematic flowchart of another power module preparation method according to an embodiment of this application.
Figure 7:
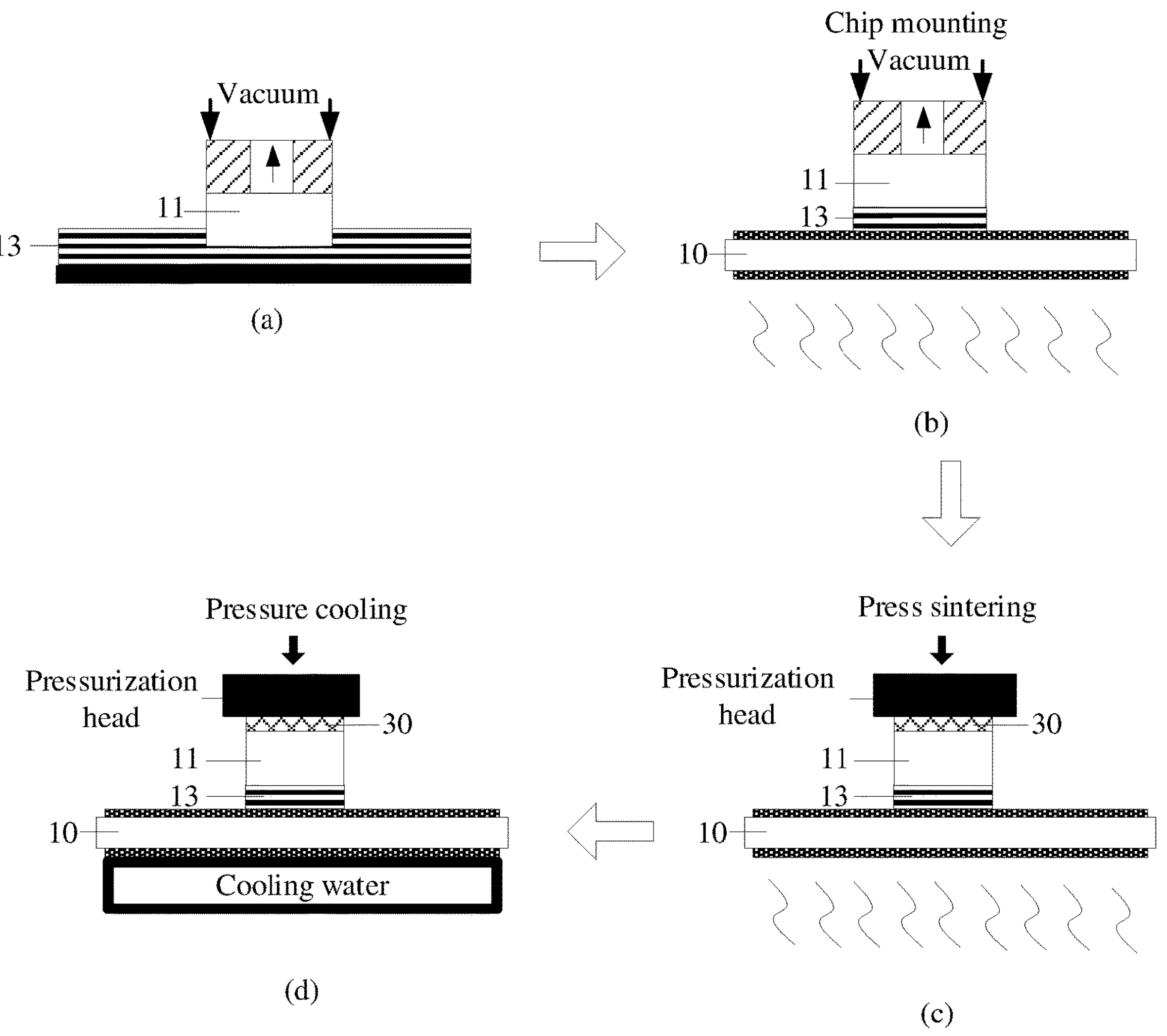
FIG. 7 is a schematic diagram of a structure of another power module preparation process according to an embodiment of this application.

For example, when the sintering material is a silver film, with reference to FIG. 6 and FIG. 7, the chip may be mounted onto the first metal layer-clad substrate by using the following steps.

S1021*b*: Adhere the sintering material to a side that is of the chip and that faces the first metal layer-clad substrate.

During specific implementation, as shown in (a) in FIG. 7, the chip 11 may be adsorbed by using a metal suction nozzle, and a temperature of the metal suction nozzle is 80° C. to 200° C. Then, the chip 11 is pressed onto a large silver film, and pressure of 0.1 MPa to 5 MPa is applied to the chip for a time of 1 ms to 10000 ms. In this way, the sintering material 13 (silver film) under the chip is compressed and semi-sintered, and adheres to the chip 11.

S1022*b*: Mount the chip to which the sintering material adheres onto the first metal layer-clad substrate, and pressurize the chip.

During specific implementation, as shown in (b) in FIG. 7, the chip 11 may be first sucked up through vacuum adsorption, then the first metal layer-clad substrate 10 may be aligned by using a profile identification system, and then the chip 11 to which the sintering material 13 (silver film) adheres may be fastened to the first metal layer-clad substrate 10 and pressurized.

For example, chip mounting conditions may be as follows: A temperature is controlled to be between 100° C. and 180° C., pressure is controlled to be between 0.1 MPa and 10 MPa, and a time is controlled to be between 10 ms and 999 ms. That is, pressure of 0.1 MPa to 10 MPa is applied to the chip mounted on the first metal layer-clad substrate for at least 10 ms in an environment with a temperature of 100° C. to 180° C.

After the chip is mounted, S103 is performed.

S103: Perform press sintering on the chip mounted on the first metal layer-clad substrate.

Press sintering refers to applying pressure to a bonded body at a high temperature, thereby increasing density of a sintered body, promoting atomic diffusion between particles of the sintering material and between the sintering material and an interface of the bonded body, and enhancing bonding strength and bonding reliability. A used press sintering technique is not limited in this application, and may be any well-known method.

During specific implementation, as shown in (e) in FIG. 5 and (c) in FIG. 7, a pressurization head may be used to perform press sintering on the chip 11 mounted on the first metal layer-clad substrate 10. An area of the pressurization head being 50 mm*50 mm is used as an example. Parallelism of the pressurization head may be set to be ≤5 μm, to reduce warpage of a product obtained through sintering.

For example, sintering conditions for performing press sintering are as follows: A sintering temperature is controlled to be between 200° C. and 300° C., applied pressure is controlled to be between 5 MPa and 30 MPa, and a sintering time is controlled to be between 1 minute and 10 minutes.

During specific implementation, a press sintering process may be performed in an air environment. To prevent the product from being oxidized, press sintering is performed, in a protective atmosphere or a vacuum environment, on the chip mounted on the first metal layer-clad substrate. The protective atmosphere may be a reducing atmosphere or an inert atmosphere. For example, the protective atmosphere may be N2, a gas mixture of N2 and H2, Ar, He, or the like. This is not limited herein.

To prevent damage caused by the pressurization head to the chip in a sintering process, as shown in (e) in FIG. 5 and (c) in FIG. 7, when press sintering is performed on the chip mounted on the first metal layer-clad substrate, a removable stress relief film 30 may be further placed between the chip 11 and the pressurization head. Therefore, when press sintering is performed, the stress relief film 30 can avoid direct contact between the pressurization head and the chip 11, and reduce damage caused by the pressurization head to the chip 11 due to stress concentration. After press sintering is completed, the stress relief film may be removed.

Optionally, a thickness of the stress relief film may be set to 50 μm to 90 μm. This is not limited herein.

For example, the stress relief film may be an organic film such as a Teflon film. This is not limited herein.

Further, to control a warping degree of the product obtained through sintering, as shown in (f) in FIG. 5 and (d) in FIG. 7, the first metal layer-clad substrate 10 and the chip 11 that are sintered may be cooled in a pressurized state.

For example, if the press sintering process is performed in a protective atmosphere or a vacuum environment, a cooling process is also performed in the protective atmosphere or the vacuum environment.

For example, cooling conditions may be as follows: Applied pressure is controlled to be between 5 MPa and 20 MPa, and a cooling time is controlled to be between 1 minute and 10 minutes.

Optionally, to enhance cooling, cooling may be performed by using water or forced nitrogen. This is not limited herein.

Optionally, after press sintering is performed on the chip mounted on the first metal layer-clad substrate, the first metal layer-clad substrate on which the chip is mounted may be further cleaned, to remove residual organic matter. For example, a plasma treatment technique or an organic solvent cleaning technique is used to remove residual organic matter at the first metal layer-clad substrate and the like, thereby increasing interface bonding performance of a subsequent molding compound, preventing the molding compound from being delaminated, and further improving reliability of the power module.

Plasma treatment refers to cleaning treatment on a surface of an object through a bombardment effect of plasma particles and the like in plasma on the surface of the object and reaction between plasma ions and organic matter.

S104: Connect a side that is of the chip and that is away from the first metal layer-clad substrate to the second metal layer-clad substrate by using an interconnection pillar.

During specific implementation, the interconnection pillar may be made of metal, alloy, or a composite material, and is configured to connect the side that is of the chip and that is away from the first metal layer-clad substrate to the second metal layer-clad substrate.

For example, a material of the interconnection pillar may be Cu, Ni, Mo, W, tungsten alloy, Cu—Mo alloy, AlSiC, nickel alloy, or the like; or may be Mo plated with Ni, Ni(P), or Cu, W plated with Ni, Ni(P), or Cu, Cu—Mo alloy plated with Ni, Ni(P), or Cu, or an AlSiC composite material plated with Ni, Ni(P), or Cu after surface sensitization treatment. Certainly, Ag or Au may be further plated on a surface of the plating layer Ni, Ni(P), or Cu.

In this application, Ni(P) is an Ni plating layer that includes phosphorus (P) and that is manufactured by using a chemical plating technique. During chemical plating, P and Ni are simultaneously precipitated from a solution and deposited on a substrate, and P is an inevitable companion.

Figure 8:
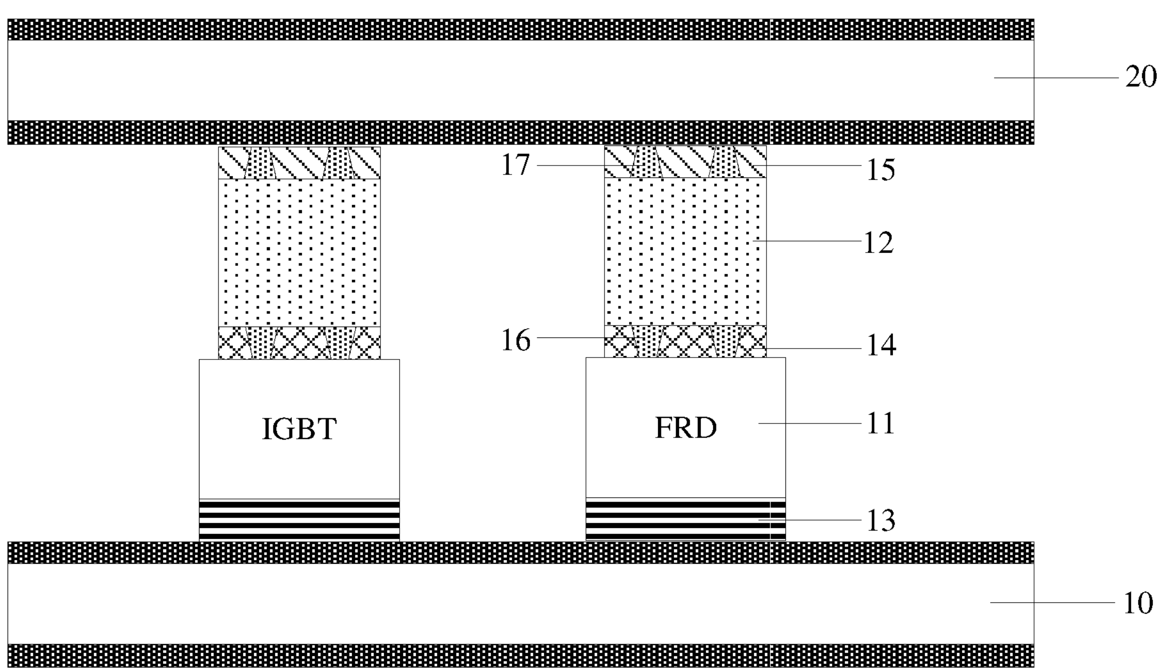
FIG. 8 is a schematic diagram of a structure of another power module according to an embodiment of this application.

A type and a quantity of chips in the power module are not limited in this application, and any quantity of chips of any type may be applied to the power module. For example, as shown in FIG. 8, the chip 11 may be an insulated gate bipolar transistor (IGBT) and a fast recovery diode (FRD). Both the IGBT chip 11 and the FRD chip 11 are electrically connected to the first metal layer-clad substrate 10 by using the sintering material 13.

During specific implementation, still with reference to FIG. 8, a gate electrode of the IGBT chip 11 may be electrically connected to the first metal layer-clad substrate 10 by using an Al wire 104.

During specific implementation, the side that is of the chip and that faces the first metal layer-clad substrate and the side that is of the chip and that is away from the first metal layer-clad substrate each have a surface electrode, and the surface electrode includes a welded or sintered metal layer, to be welded or sintered with another electrical component.

For example, the welded or sintered metal layer may include Ti/Ni/Ag, Ti/Ni/Au, Ti/NiV/Ag, Ti/NiV/Au, Ni(P)/Pd/Au, Ni(P)/Pd/Ag, Ni(P)/Au, Ni(P)/Ag, or the like.

In this application, NiVis alloy of Ni and V. When the surface electrode of the chip is manufactured, a NiV target material is used to manufacture a plating layer by using a sputtering technique.

Optionally, to release stress generated on the chip during welding or sintering of the chip, thereby improving the reliability of the power module, a stress buffer metal layer may be added to the surface electrode. A material of the stress buffer metal layer may be soft metal whose hardness is less than HV60, for example, aluminum, aluminum alloy, copper, magnesium alloy, zinc, zinc alloy, silver, silver alloy, gold, or gold alloy. Stress of a joint is released by using a softness characteristic of the soft metal.

During specific implementation, when the material of the stress buffer metal layer is non-weldable metal, for example, aluminum, aluminum alloy, or magnesium alloy, the stress buffer metal layer may be disposed under the welded or sintered metal layer.

For example, the stress buffer metal layer may be disposed only in the surface electrode on the side that is of the chip and that faces the first metal layer-clad substrate, or the stress buffer metal layer may be disposed only in the surface electrode on the side that is of the chip and that faces the interconnection pillar, or the stress buffer metal layer may be disposed in the surface electrodes on both sides of the chip. This is not limited herein.

Figure 9:
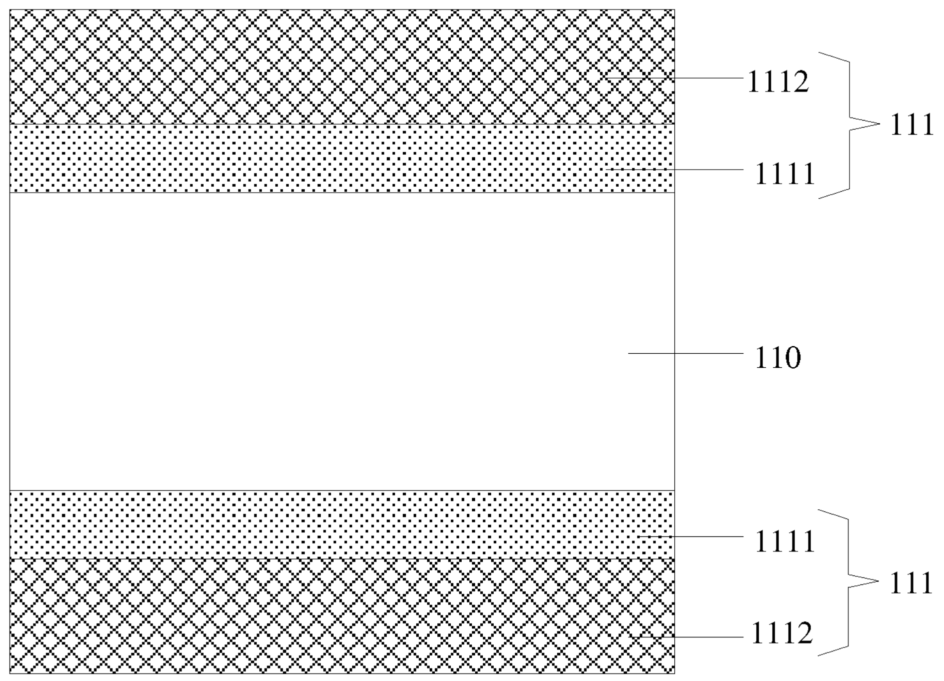
FIG. 9 is a schematic diagram of a structure of a chip according to an embodiment of this application.

For example, the material of the stress buffer metal layer is aluminum or aluminum alloy. As shown in FIG. 9, the chip 11 may include a semiconductor body 110, and surface electrodes 111 are disposed on surfaces of the semiconductor body 110. A stress buffer metal layer 1111 is disposed in a surface electrode 111 on the side that is of the chip 11 and that faces the first metal layer-clad substrate, and the stress buffer metal layer 1111 is located on a side that is of a welded or sintered metal layer 1112 and that is away from the first metal layer-clad substrate, that is, the stress buffer metal layer 1111 is located between the welded or sintered metal layer 1112 and the semiconductor body 110; and/or a stress buffer metal layer 1111 is disposed in a surface electrode 111 on the side that is of the chip 11 and that faces the interconnection pillar, and the stress buffer metal layer 1111 is located on a side that is of a welded or sintered metal layer 1112 and that is away from the interconnection pillar, that is, the stress buffer metal layer 1111 is located between the welded or sintered metal layer 1112 and the semiconductor body 110. FIG. 9 illustrates an example in which stress buffer metal layers 1111 are disposed in the surface electrodes 111 on both sides of the chip 11.

During specific implementation, when the surface electrode of the chip is formed, an Al film or an Al alloy layer may be first formed by using a physical vapor deposition (PVD) method or another method. Because a protective oxide film is easily formed on a surface of Al, Al is non-weldable. To perform welding or sintering on non-weldable Al, weldable metal and metal with surface wettability may be chemically plated on the stress buffer metal layer, to form the welded or sintered metal layer. Alternatively, the welded or sintered metal layer may be manufactured on a surface by using a plasma PVD method or the like.

In a feasible implementation, when the surface electrode of the chip is formed, an Al film may be first formed by using the PVD method or another method, then Zn is used to replace an aluminum oxide film through zincate treatment, and then Ni(P) is chemically plated to replace Zn, or gold (Au) or silver (Ag) may be chemically plated on the Ni(P) layer. That is, the surface electrode includes a stress buffer metal layer Al and a welded or sintered metal layer Ni(P)/Au or Ni(P)/Ag. Phosphorus content in Ni(P) is generally 5 wt. % to 12 wt. %. Alternatively, after an Al film is formed, Ti/Ni/Ag may be formed by using the PVD method. That is, the surface electrode includes a stress buffer metal layer Al and a welded or sintered metal layer Ti/Ni/Ag.

Certainly, when the surface electrode is formed, the stress buffer metal layer may not be formed, but the welded or sintered metal layer, such as Ti/Ni/Ag, Ti/Ni/Au, Ti/NiV/Ag, Ti/NiV/Au, Ni(P)/Pd/Au, or Ni(P)/Pd/Ag, is directly formed by using the PVD method.

A thickness of the surface electrode of the chip is not limited in this application, and is set based on an actual product. For example, the thickness of the surface electrode may be controlled to be between 2 μm and 10 μm.

Figure 10:
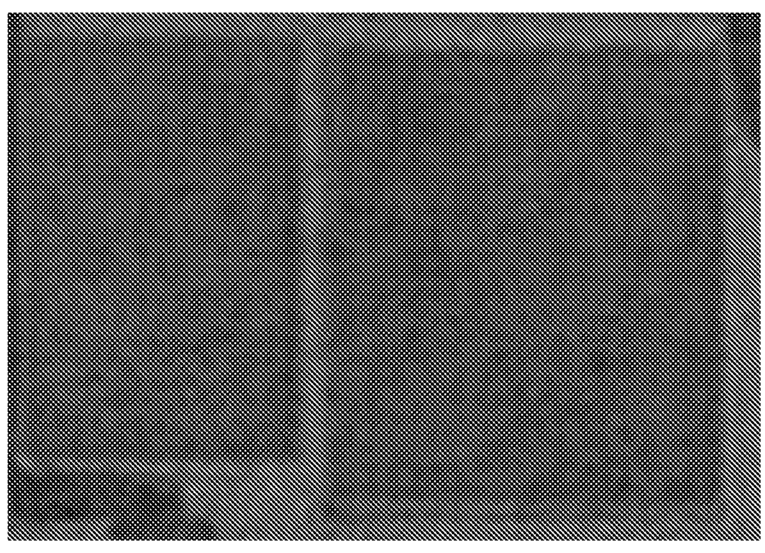
FIG. 10 is a diagram of an ultrasonic scan photo of a sintered layer according to an embodiment of this application.

For example, a chip having a stress buffer metal layer is sintered onto a metal-clad ceramic substrate by using micrometer silver particle paste filled with a filler. In a harsh state without a molding compound, an ultrasonic (SAT) scan photo of a sintered layer after 1000 times of temperature shock (−40° C. to 125° C.) is shown in FIG. 10. It can be seen from FIG. 10 that the sintered layer is not stripped. Therefore, it can be learned that high-reliability bonding can be implemented by sintering a chip having a stress buffer metal layer by using silver paste whose elastic modulus and coefficient of thermal expansion are reduced.

In this application, after the chip is connected to the first metal layer-clad substrate through press sintering, as shown in FIG. 1 and FIG. 8, the chip may be connected to the interconnection pillar 12 by using first solder 14, and the interconnection pillar 12 is connected to the second metal layer-clad substrate 20 by using second solder 15. During specific implementation, the first solder may be used to connect the interconnection pillar to the side that is of the chip and that is away from the first metal layer-clad substrate in a welding manner, and the second solder may be used to connect a side that is of the interconnection pillar and that is away from the chip to the second metal layer-clad substrate in a welding manner.

For example, the first solder and the second solder may be made of solder paste or a soldering lug. The first solder may be high-temperature solder, for example, high-lead solder or Au-based solder, and the second solder may be medium-temperature solder, for example, SAC305 or Sn—Sb solder.

Figure 11:
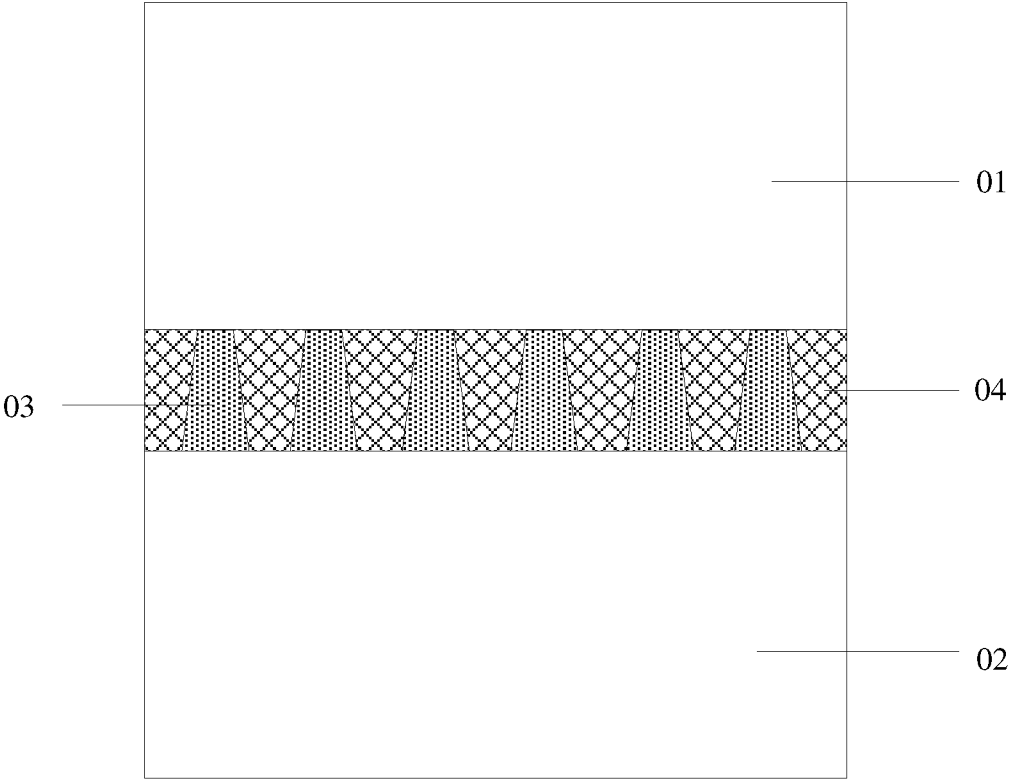
FIG. 11 is a schematic diagram of a structure in which a support pillar is disposed between two bonded bodies welded by using solder according to an embodiment of this application.

During specific implementation, a thickness of solder has significant impact on solder bonding reliability and the like. To ensure that the thickness of the solder is controllable and uniform, as shown in FIG. 11, a support pillar 03 may be disposed between two bonded bodies 01 and 02 (two objects welded by using the solder, for example, the chip and the interconnection pillar, or the interconnection pillar and the second metal layer-clad substrate). In this way, the support pillar 03 is used to control a thickness and uniformity of the thickness of solder 04 between the two bonded bodies 01 and 02. The support pillar 03 may be formed on either of the two bonded bodies 01 and 02.

For example, in this application, as shown in FIG. 8, at least one first support pillar 16 is disposed between the interconnection pillar 12 and the chip 11, where the at least one first support pillar 16 may be formed on a side that is of the interconnection pillar 12 and that faces the chip 11, that is, formed on the interconnection pillar 12; or the at least one first support pillar 16 may be formed on a side that is of the chip 11 and that faces the interconnection pillar 12, that is, formed on the chip 11.

For example, in this application, as shown in FIG. 8, at least one second support pillar 17 is disposed between the interconnection pillar 12 and the second metal layer-clad substrate 20, where the at least one second support pillar 17 may be formed on a side that is of the interconnection pillar 12 and that faces the second metal layer-clad substrate 20, that is, formed on the interconnection pillar 12; or the at least one second support pillar 17 may be formed on a side that is of the second metal layer-clad substrate 20 and that faces the interconnection pillar 12, that is, formed on the second metal layer-clad substrate 20.

A quantity of first support pillars and a quantity of second support pillars are not limited in this application, and are specifically determined based on an area of a welding zone. A larger area of the welding zone indicates a larger quantity of support pillars.

In this application, a size of a support pillar may be set to a size at a micrometer level, and the support pillar is mainly used to support bonded bodies located on both sides of the support pillar, to control a thickness of solder and ensure uniformity of the thickness of the solder.

Optionally, materials of the first support pillar and the second support pillar are conductive materials. For example, the first support pillar and the second support pillar may be made of at least one of Al, Al alloy, Au, Au alloy, Cu, Cu alloy, Ni, Ni alloy, copper coated with aluminum, Cu—Sn alloy with a high melting point, or high-temperature solder.

During specific implementation, a height of a support pillar is determined based on a target thickness of solder. For example, the thickness of the support pillar may be controlled to be between 0.02 mm and 10 mm.

For example, a support pillar of a size at the micrometer level may be implanted on a bonded body by using a supersonic technology, and a small-size support pillar does not affect a welding technique of solder and solder reliability. Initially, the implanted support pillar may be spherical or cylindrical. Then, the implanted support pillar is leveled, so that a height of the implanted support pillar is adjustable and controllable. In this way, a thickness and a warping degree of the solder are controllable in a welding process.

Figure 12:
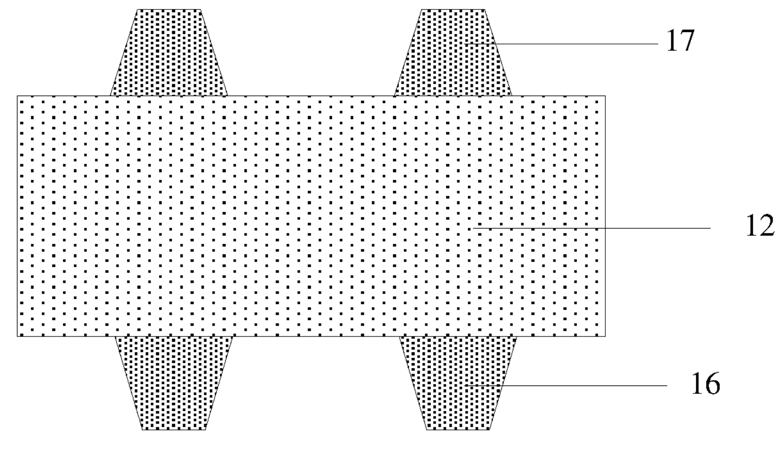
FIG. 12 is a schematic diagram of a structure of an interconnection pillar according to an embodiment of this application.

For example, as shown in FIG. 12, that support pillars are implanted on both sides of the interconnection pillar 12 is used as an example. A metal ball of a size at the micrometer level is implanted on the side that is of the interconnection pillar 12 and that faces the chip by using the supersonic technology, and the implanted metal ball is leveled to form a first support pillar 16. Then, the interconnection pillar 12 is placed in a jig with a side that is of the interconnection pillar 12 and that has the first support pillar 16 facing downward, so that the implanted first support pillar 16 enters a hole of the jig. Through positioning of the jig, a metal ball is implanted on the side that is of the interconnection pillar 12 and that faces the second metal layer-clad substrate by using a same method, and the implanted metal ball is leveled to form a second support pillar 17, so that support pillars are disposed at symmetrical positions on both sides of the interconnection pillar 12, thereby facilitating recognition and grasping during automated mounting.

The metal balls may be leveled by pressing and flattening the metal balls, so that heights of the implanted metal balls are consistent, and the heights of the implanted metal balls meet a designed solder thickness requirement, thereby controlling a solder thickness to be uniform.

Figure 13:
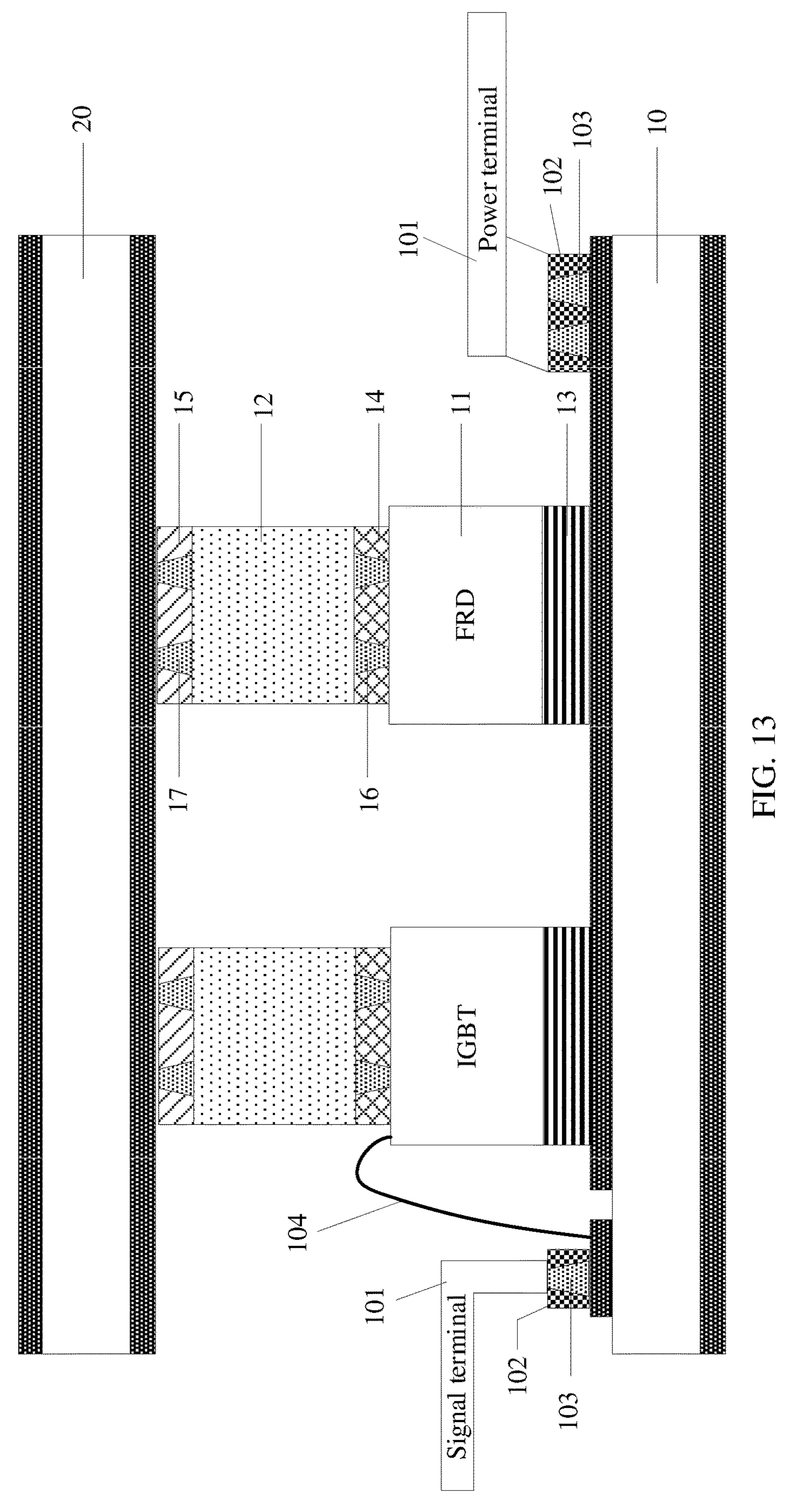
FIG. 13 is a schematic diagram of a structure of another power module according to an embodiment of this application.

As shown in FIG. 13, in addition to the chip 11 and the interconnection pillar 12, the power module in this application may further include an electronic component 101 located on a side that is of the first metal layer-clad substrate 10 and that faces the second metal layer-clad substrate 20, and the electronic component 101 is connected to the first metal layer-clad substrate 10 by using third solder 102.

For example, the third solder may be high-temperature solder, for example, high-lead solder or Au-based solder.

For example, as shown in FIG. 13, the electronic component in this application includes any electronic component, such as a signal terminal in FIG. 13, a power terminal in FIG. 13, or a thermistor, that is welded onto the first metal layer-clad substrate 10 by using solder.

To improve bonding reliability between the electronic component and the first metal layer-clad substrate, as shown in FIG. 13, at least one third support pillar 103 is further disposed between the electronic component 101 and the first metal layer-clad substrate 10. The at least one third support pillar 103 may be formed on a side that is of the electronic component 101 and that faces the first metal layer-clad substrate 10, or may be formed on a side that is of the first metal layer-clad substrate 10 and that faces the electronic component 101. This is not limited herein.

During specific implementation, for implementation of the third support pillar, refer to implementation of the first support pillar and the second support pillar. Details are not described herein.

In this application, the first solder, the second solder, and the third solder may be made of solder paste or a soldering lug. This is not limited herein.

Optionally, all solder in this application may be made of a same material. For example, the first solder, the second solder, and the third solder are made of same solder. In this way, welding between the chip and the interconnection pillar, welding between the interconnection pillar and the second metal layer-clad substrate, and welding between the electronic component and the first metal layer-clad substrate may be completed through reflow soldering once, thereby simplifying process steps and reducing costs.

Certainly, during specific implementation, the first solder, the second solder, and the third solder may alternatively be different solder. This is not limited herein. For example, the first solder and the third solder may be high-temperature solder, for example, high-lead solder or Au-based solder, and the second solder may be medium-temperature solder, for example, SAC305 or Sn—Sb solder.

Figure 14:
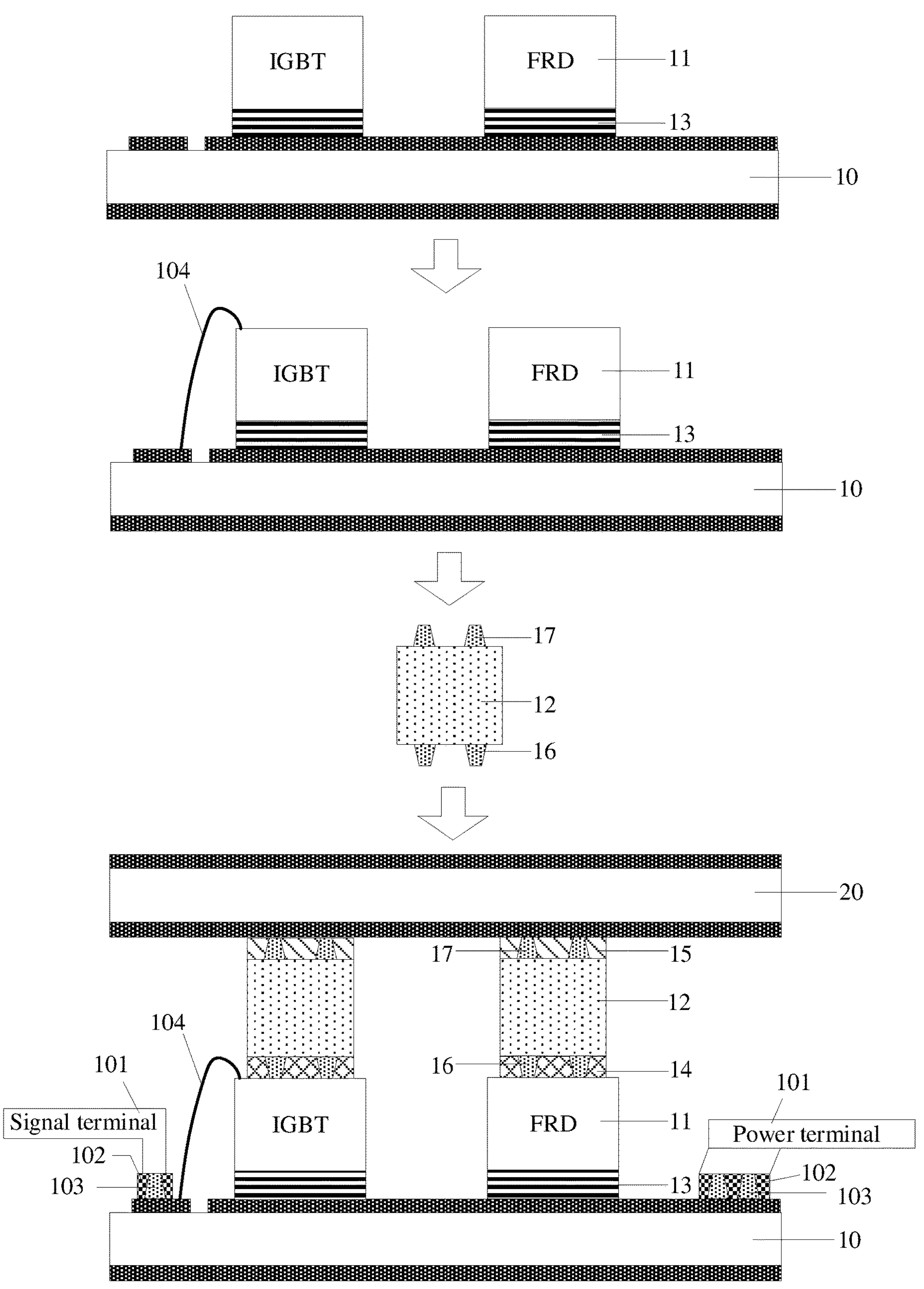
FIG. 14 is a schematic diagram of a structure of still another power module preparation process according to an embodiment of this application.

For example, the power module shown in FIG. 13 is used as an example. With reference to FIG. 14, after press sintering is performed on the chip 11 and the first metal layer-clad substrate 10, the gate electrode of the IGBT chip 11 is bonded to the first metal layer-clad substrate 10 by using the Al wire 104. Then, the first support pillar 16 and the second support pillar 17 are formed on both sides of the interconnection pillar 12. Then, a third support pillar 103 is implanted on a surface of the first metal layer-clad substrate 10 by using the supersonic technology. Then, the first solder 14 is formed between the chip 11 and the interconnection pillar 12, the second solder 15 is formed between the interconnection pillar 12 and the second metal layer-clad substrate 20, and the third solder 102 is formed between the electronic component 101 (the power terminal and the signal terminal) and the first metal layer-clad substrate 10. The solder may be a soldering lug or solder paste, the soldering lug may be formed through mounting, and the solder paste may be formed by using a printing technique. The soldering lug or the solder paste may be high-temperature solder, for example, high-lead solder or Au-based solder.

Then, vacuum reflow is performed, so that the chip 11 and the interconnection pillar 12, the interconnection pillar 12 and the second metal layer-clad substrate 20, and the electronic component 101 (the power terminal and the signal terminal) and the first metal layer-clad substrate 10 are welded together. In this way, components of the power module are bonded together. Because a support pillar is implanted in solder of each bonded body, a thickness and a warping degree of the solder can be controlled.

Figure 15:
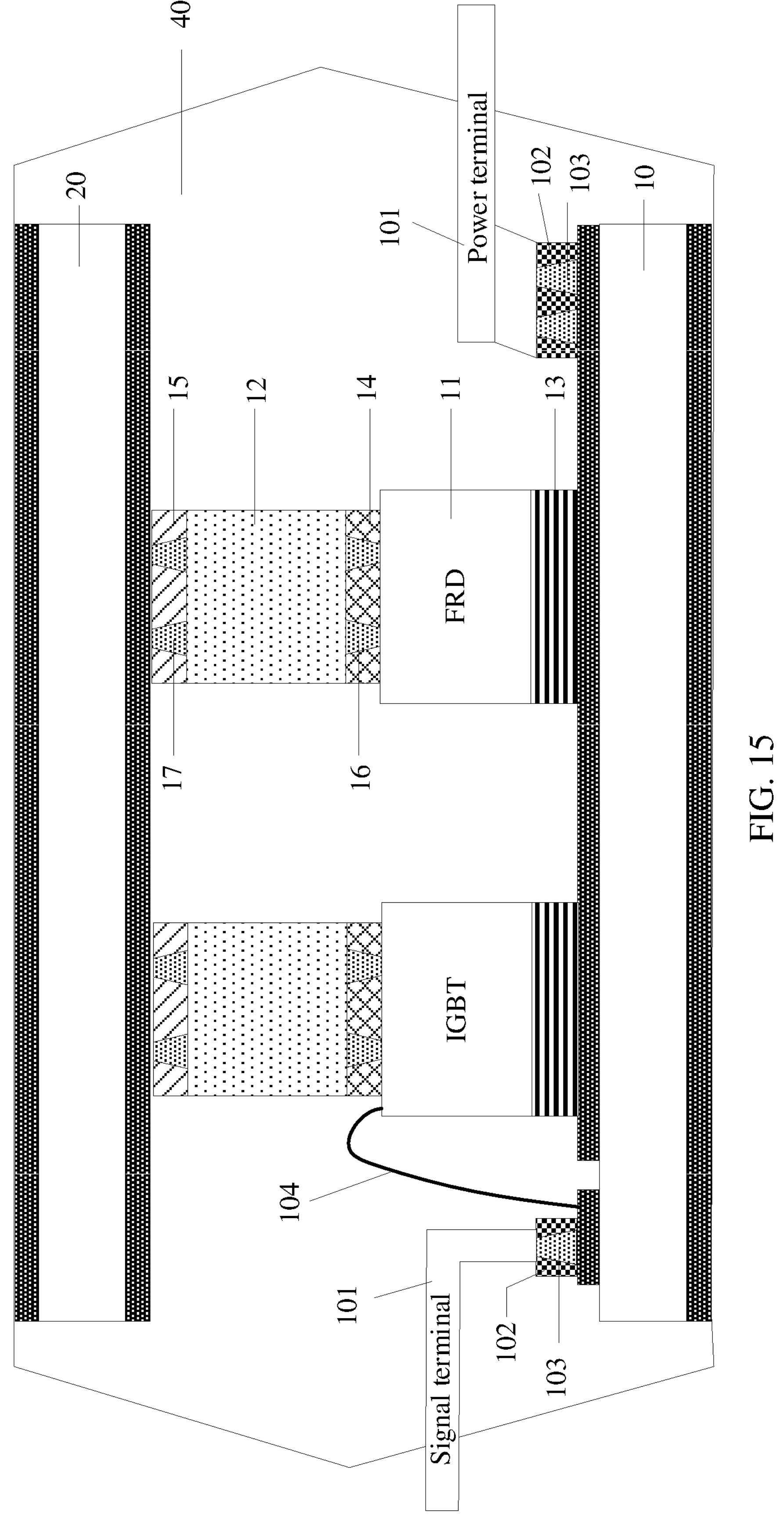
FIG. 15 is a schematic diagram of a structure of another power module according to an embodiment of this application.

After internal interconnection of the power module is completed, plastic packaging needs to be performed. During specific implementation, as shown in FIG. 15, a molding compound 40 is filled between the first metal layer-clad substrate 10 and the second metal layer-clad substrate 10, and the first metal layer-clad substrate 10 and the second metal layer-clad substrate 20 are packaged in plastic.

To prevent delamination between the molding compound and a molding compound interface, thereby improving the reliability of the power module, a molding compound with a low modulus is used as the molding compound. For example, the molding compound may be made of a material whose elastic modulus is between 0.5 GPa and 20 GPa, for example, an epoxy molding compound. This is not limited herein.

During specific implementation, after plastic packaging is completed, upper and lower surfaces of the power module may be ground, so that the two surfaces of the power module are parallel. Certainly, based on a requirement, it may alternatively be unnecessary to perform grinding.

For example, after plastic packaging, an exposed terminal (for example, the signal terminal and the power terminal) may be further plated with tin, to prevent the terminal from being oxidized and increase solderability of the terminal.

Figure 16:
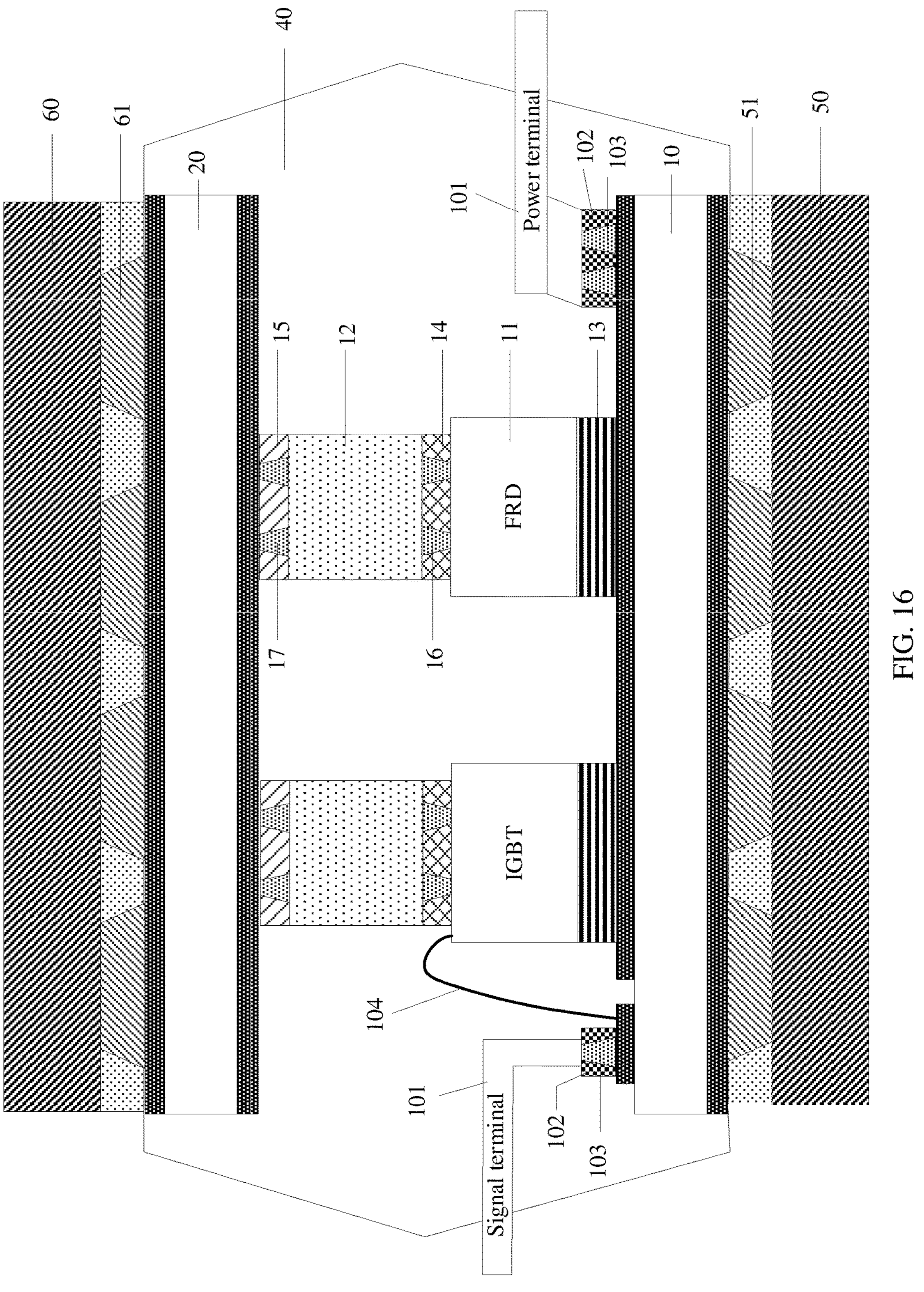
FIG. 16 is a schematic diagram of a structure of another power module according to an embodiment of this application.

As shown in FIG. 16, the power module in this application may further include a first heat sink 50 located on a side that is of the first metal layer-clad substrate 10 and that is away from the second metal layer-clad substrate 20, and a second heat sink 60 located on a side that is of the second metal layer-clad substrate 20 and that is away from the first metal layer-clad substrate 10, to cool the module on both sides, thereby improving power density and module reliability of the power module.

For example, the first heat sink and the second heat sink may be water-cooled heat sinks. This is not limited herein.

During specific implementation, the first metal layer-clad substrate and the first heat sink may be bonded by using thermally conductive silicone grease, and the second metal layer-clad substrate and the second heat sink may be bonded by using thermally conductive silicone grease.

Optionally, to improve a heat dissipation effect, the first heat sink may be connected to the first metal layer-clad substrate in a welding manner or a sintering manner; and/or the second heat sink may be connected to the second metal layer-clad substrate in a welding manner or a sintering manner.

For example, the first heat sink may be connected to the first metal layer-clad substrate in the welding manner, and the second heat sink may be connected to the second metal layer-clad substrate in the welding manner.

Further, as shown in FIG. 16, there is a first support component between the first heat sink 50 and the first metal layer-clad substrate 10, and the first support component may include a plurality of fourth support pillars 51 or metal wires; and/or there is a second support component between the second heat sink 60 and the second metal layer-clad substrate 20, and the second support component may include a plurality of fifth support pillars 61 or metal wires, so that the first support component and the second support component are used to control a solder thickness, thereby ensuring welding reliability.

During specific implementation, the metal wire may be bonded and fastened to a joint surface of the heat sink or a heat dissipation surface of the power module, to prevent the metal wire from flowing with liquid metal during backflow.

During specific implementation, when the first support component includes a plurality of fourth support pillars, the fourth support pillars may be formed on the first heat sink, or may be formed on the first metal layer-clad substrate. This is not limited herein. During specific implementation, for implementation of the fourth support pillar, refer to implementation of the first support pillar and the second support pillar. Details are not described herein.

During specific implementation, when the second support component includes a plurality of fifth support pillars, the fifth support pillars may be formed on the second heat sink, or may be formed on the second metal layer-clad substrate. This is not limited herein. During specific implementation, for implementation of the fifth support pillar, refer to implementation of the first support pillar and the second support pillar. Details are not described herein.

Correspondingly, an embodiment of this application further provides a power supply circuit, including a circuit board and any one of the power modules provided in embodiments of this application. The power module is electrically connected to the circuit board, and the circuit board provides a signal for the power module. A problem-resolving principle of the power supply circuit is similar to that of the foregoing power module. Therefore, for implementation of the power supply circuit, refer to implementation of the foregoing power module. No repeated description is provided.

Correspondingly, an embodiment of this application further provides a chip. With reference to FIG. 9, a surface electrode 111 of the chip 11 includes a stress buffer metal layer 1111 and a welded or sintered metal layer 1112 that are disposed in a laminated manner. A material of the stress buffer metal layer 1111 may be soft metal whose hardness is less than HV60, and stress of a joint is released by using a softness characteristic of the soft metal.

For example, the soft metal may include at least one of aluminum, aluminum alloy, copper, magnesium alloy, zinc, zinc alloy, silver, silver alloy, gold, gold alloy, and the like. This is not limited herein.

During specific implementation, when the material of the stress buffer metal layer is non-weldable metal, for example, aluminum, aluminum alloy, or magnesium alloy, the stress buffer metal layer may be disposed under the welded or sintered metal layer.

For example, the welded or sintered metal layer may include Ti/Ni/Ag, Ti/Ni/Au, Ti/NiV/Ag, Ti/NiV/Au, Ni(P)/Pd/Au, or Ni(P)/Pd/Ag. This is not limited herein.

It is clear that a person skilled in the art can make various modifications and variations to this application without departing from the spirit and scope of this application. This application is intended to cover these modifications and variations of this application provided that they fall within the scope of the claims of this application and equivalent technologies thereof.

What is claimed is:

1. A power module for use in a power supply, comprising:

a first metal layer-clad substrate and a second metal layer-clad substrate disposed opposite to each other;

a chip; and an interconnection pillar, wherein the chip and the interconnection pillar are located between the first metal layer-clad substrate and the second metal layer-clad substrate, a sintering material is disposed between the chip and the first metal layer-clad substrate, the chip and the first metal layer-clad substrate are electrically connected by using the sintering material, and the sintering material comprises silver paste, copper paste, or a silver film, and the interconnection pillar is located between the chip and the second metal layer-clad substrate, and the chip is connected to the second metal layer-clad substrate by using the interconnection pillar.

2. The power module according to claim 1, wherein the sintering material comprises a matrix material and a filler filled in the matrix material, and a coefficient of thermal expansion of the filler is less than a coefficient of thermal expansion of the matrix material.

3. The power module according to claim 1, wherein the silver paste comprises micrometer silver particle paste and nanometer silver particle paste.

4. The power module according to claim 3, wherein the filler comprises nickel, nickel alloy, copper, nickel-plated copper, titanium, titanium alloy, iron, ferroalloy, Kovar alloy, or SiC powder.

5. The power module according to claim 1, wherein the chip has a first side facing the first metal layer-clad substrate and a second side away from the first metal layer-clad substrate, each of the first side and the second side has a surface electrode comprising a welded or sintered metal layer, the surface electrode of the first side of the chip further comprises a stress buffer metal layer located on a side of the welded or sintered metal layer away from the first metal layer-clad substrate, and the surface electrode of the second side of the chip further comprises a stress buffer metal layer located on a side of the welded or sintered metal layer that faces the first metal layer-clad substrate, and the stress buffer metal layer is formed of soft metal having a hardness less than HV60.

6. The power module according to claim 5, wherein the stress buffer metal layer is formed of aluminum, aluminum alloy, copper, magnesium alloy, zinc, zinc alloy, silver, silver alloy, gold, or gold alloy.

7. The power module according to claim 6, wherein the welded or sintered metal layer comprises Ti/Ni/Ag, Ti/Ni/Au, Ti/NiV/Ag, Ti/NiV/Au, Ni(P)/Pd/Au, Ni(P)/Pd/Ag, Ni(P)/Au, or Ni(P)/Ag.

8. The power module according to claim 1, wherein the chip is connected to the interconnection pillar by using solder of a first type, and the interconnection pillar is connected to the second metal layer-clad substrate by using solder of a second type.

9. The power module according to claim 8, further comprising:

a first support pillar located between the interconnection pillar and the chip, wherein the first support pillar is formed on a side of the interconnection pillar facing the chip or on a side of the chip facing the interconnection pillar; and a second support pillar located between the interconnection pillar and the second metal layer-clad substrate, wherein the second support pillar is formed on a side of the interconnection pillar facing the second metal layer-clad substrate or on a side of the second metal layer-clad substrate facing the interconnection pillar.

10. The power module according to claim 1, further comprising an electronic component located on a side of the first metal layer-clad substrate facing the second metal layer-clad substrate, wherein the electronic component is connected to the first metal layer-clad substrate by using solder of a third type.

11. The power module according to claim 10, further comprising a third support pillar located between the electronic component and the first metal layer-clad substrate, wherein the third support pillar is disposed on a side of the electronic component facing the first metal layer-clad substrate or on a side of the first metal layer-clad substrate facing the electronic component.

12. The power module according to claim 9, wherein the support pillar is formed of a conductive material.

13. The power module according to claim 12, wherein the support pillar is formed of aluminum, aluminum alloy, gold, gold alloy, copper, copper alloy, nickel, nickel alloy, copper coated with aluminum, copper-tin alloy with a high melting point, or high-temperature solder.

14. The power module according to claim 1, further comprising a molding compound filled between the first metal layer-clad substrate and the second metal layer-clad substrate, wherein the molding compound is used to package the first metal layer-clad substrate and the second metal layer-clad substrate in plastic, and has an elastic modulus of 0.5 GPa to 20 GPa.

15. The power module according to claim 1, further comprising a first heat sink located on a side of the first metal layer-clad substrate away from the second metal layer-clad substrate, and a second heat sink located on a side of the second metal layer-clad substrate away from the first metal layer-clad substrate.

16. The power module according to claim 15, wherein the first heat sink is connected to the first metal layer-clad substrate by welding or a sintering, and the second heat sink is connected to the second metal layer-clad substrate by welding or sintering.

17. The power module according to claim 16, further comprising:

a first support component disposed between the first heat sink and the first metal layer-clad substrate, wherein the first support component comprises a plurality of fourth support pillars or metal wires; and a second support component disposed between the second heat sink and the second metal layer-clad substrate, wherein the second support component comprises a plurality of fifth support pillars or metal wires.

18. The power module according to claim 1, wherein the chip comprises a surface electrode having a welded or sintered metal layer and a stress buffer metal layer disposed in a laminated manner.

19. The power module according to claim 18, wherein the stress buffer metal layer is formed of soft metal with a hardness less than HV60.

20. The power module according to claim 19, wherein the stress buffer metal layer is formed of aluminum, aluminum alloy, copper, magnesium alloy, zinc, zinc alloy, silver, silver alloy, gold, or gold alloy.

* * * * *